United States Patent [19]
Aoki et al.

[11] Patent Number: 6,046,929
[45] Date of Patent: Apr. 4, 2000

[54] MEMORY DEVICE WITH TWO FERROELECTRIC CAPACITORS PER ONE CELL

[75] Inventors: Masaki Aoki; Akio Itoh; Mitsuteru Mushiga; Ko Nakamura; Takashi Eshita, all of Kawasaki, Japan

[73] Assignee: Fujitsu Limited, Kawasaki, Japan

[21] Appl. No.: 09/282,469

[22] Filed: Mar. 31, 1999

[30] Foreign Application Priority Data

| Apr. 6, 1998 | [JP] | Japan | 10-093062 |
| Apr. 30, 1998 | [JP] | Japan | 10-119805 |
| Nov. 2, 1998 | [JP] | Japan | 10-311956 |

[51] Int. Cl.$^7$ ............................................. G11C 11/22
[52] U.S. Cl. ................................... 365/145; 365/149
[58] Field of Search ........................... 365/145, 149

[56] References Cited

U.S. PATENT DOCUMENTS 5,903,492   5/1999   Takashima ............................. 365/145

OTHER PUBLICATIONS

JP-A 5-90607 Laid-open: Apr. 9, 1993.

*Primary Examiner*—David Nelms
*Assistant Examiner*—M. Tran
*Attorney, Agent, or Firm*—Armstrong, Westerman, Hattori, McLeland & Naughton

[57] ABSTRACT

The source region and gate electrode of a field effect transistor including a drain region and a gate electrode in addition to the source region are connected by a first ferroelectric capacitor. The drain region and gate electrode are connected by a second ferroelectric capacitor. A ferroelectric memory device suitable for high integration is provided.

21 Claims, 24 Drawing Sheets

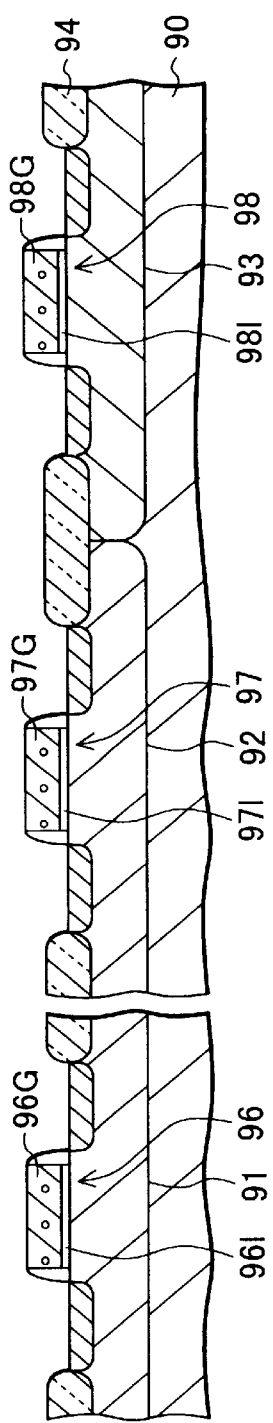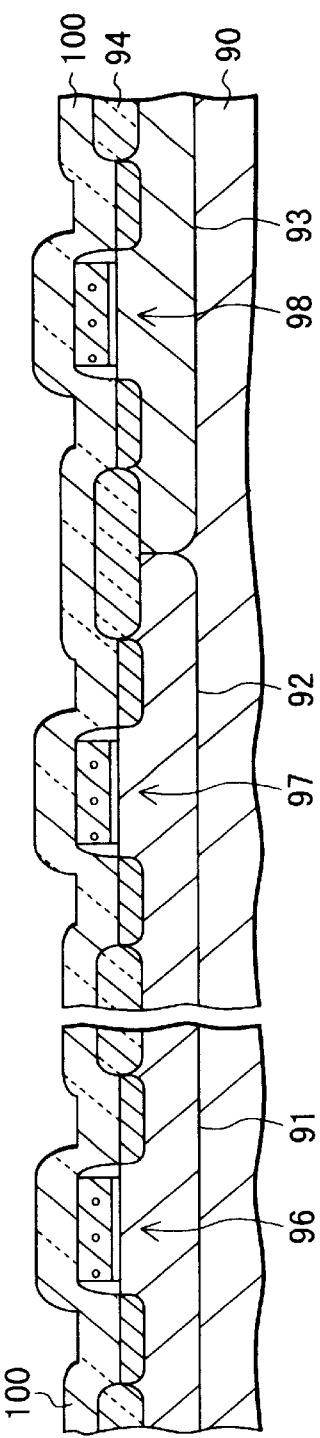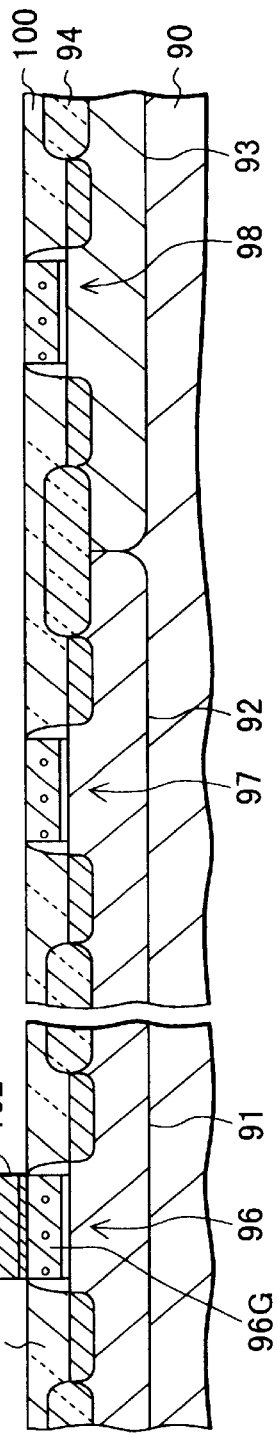

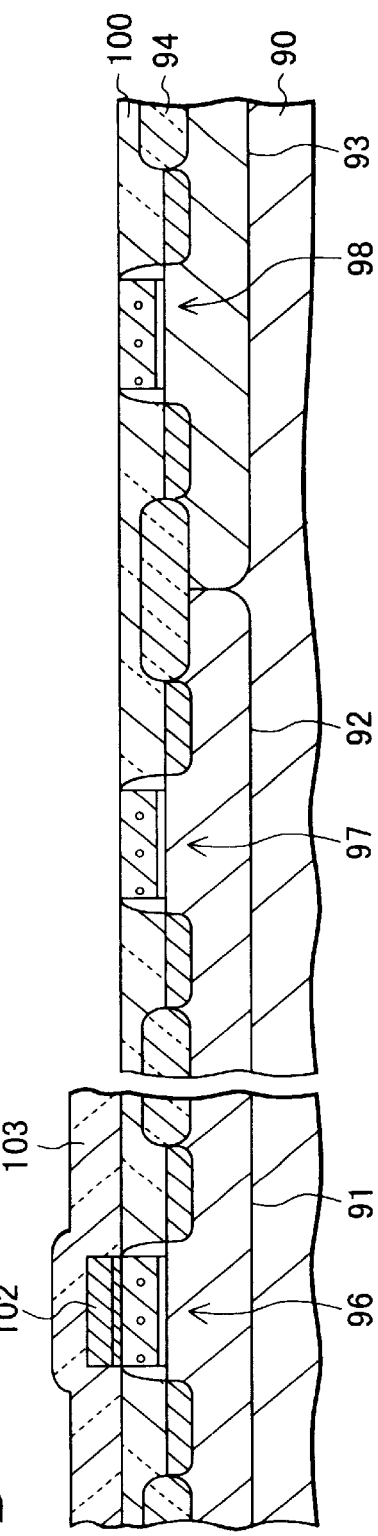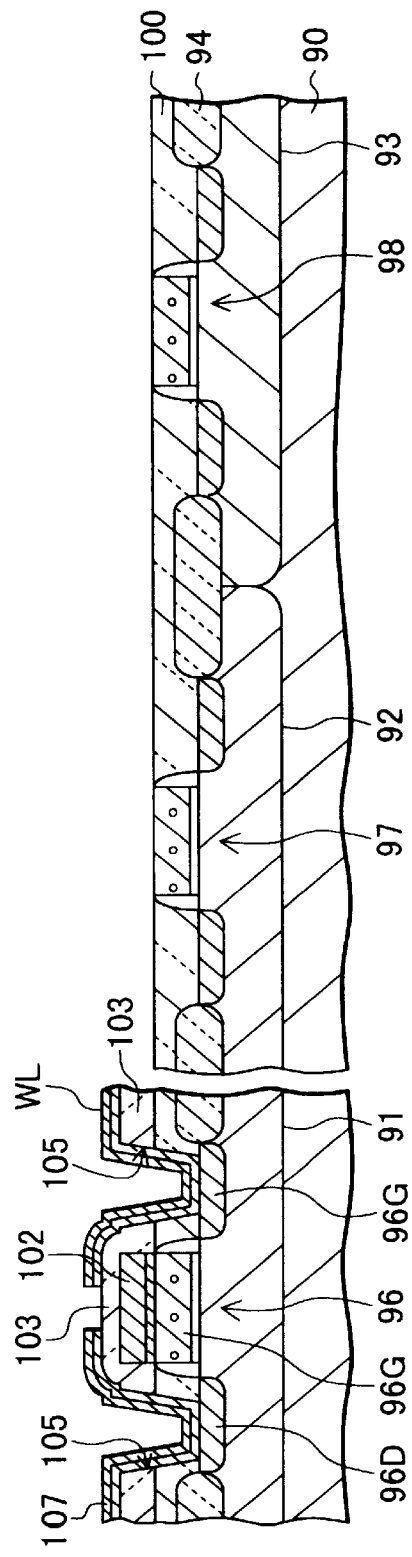

MEMORY DEVICE WITH TWO FERROELECTRIC CAPACITORS PER ONE CELL

This application is based on Japanese patent applications HEI 10-93062 filed on Apr. 6, 1998, HEI 10-119805 filed on Apr. 30, 1998, HEI 10-311956 filed on Nov. 2, 1998, and HEI 11-46855 filed on Feb. 24, 1999, the whole contents of which are incorporated herein by reference.

BACKGROUND OF THE INVENTION a) Field of the Invention

The present invention relates to a ferroelectric memory device, and more particularly to a ferroelectric memory device whose memory cell is constituted of a field electric transistor and two ferroelectric capacitors.

b) Description of the Related Art

Dynamic random access memories (DRAM) have taken the main trend of semiconductor storage devices. DRAM is a volatile memory whose storage contents are extinguished when a power supply stops. Nonvolatile memories whose storage contents are not extinguished even if a power supply stops, are being developed.

Recently, as one type of nonvolatile memories, ferroelectric memories using ferroelectric material have drawn attention. Ferroelectric memories are roughly divided into two types. One type detects the storage contents from a change in the storage capacitance of a ferroelectric capacitor, and the other type detects the storage contents from a change in the resistance of semiconductor to be caused by residual polarization of a ferroelectric film.

A ferroelectric memory of the former type includes 2Tr-2C type and 1TR-1C type. 2Tr-2C type stores one-bit data by using two transistors and two capacitors, whereas 1Tr-1C type stores one-bit data by using one transistor and one capacitor. As a ferroelectric memory of the latter type, 1Tr type is known which has a gate insulating film made of ferroelectric material.

As ferroelectric memories of 2Tr-2C type, memories having 64 k bits are realized in practice. It is, however, difficult to increase an integration degree because two transistors and two capacitors are required to store one-bit data. Ferroelectric memories of 1Tr-1C type are easy to raise an integration degree. However, reference cells are likely to be deteriorated as operation time becomes long, so that it is difficult to improve reliability and realize long lifetime.

Ferroelectric memories of 1Tr type are still in the stage that the operation thereof only at a cell level is confirmed, and the drive method of a cell array is not yet established. In addition, a source line as well as a word line and a bit line is necessary and isolation of a back gate is necessary, so that the cell area is difficult to be reduced.

SUMMARY OF THE INVENTION

It is an object of the present invention to provide a ferroelectric memory device suitable for high integration.

According to one aspect of the present invention, there is provided a ferroelectric memory device comprising: a field effect transistor including a source region, a drain region, and a gate electrode; a first ferroelectric capacitor connected between the source region and the gate electrode; and a second ferroelectric capacitor connected between the drain region and the gate electrode.

By applying a predetermined voltage across the source and drain regions, residual polarization can be generated in the ferroelectric film of a ferroelectric capacitor. The directions of this residual polarization are related to data "0" and "1" so that data can be stored.

According to another aspect of the present invention, there is provided a ferroelectric memory device comprising: a plurality of first wirings extending along a first direction on a surface of a substrate; a plurality of second wirings extending along a second direction on the surface of the substrate, the second direction intersecting the first direction; an interlayer insulating film for electrically insulating the first and second wirings at each cross point between the first and second wirings; and a plurality of memory cells each disposed at each cross point between the first and second wirings, each of the memory cells comprising a field effect transistor, a first ferroelectric capacitor, and a second ferroelectric capacitor, each field effect transistor including a source region, a drain region, and a gate electrode, the first ferroelectric capacitor being connected between the source region and the gate electrode of the field effect transistor of a corresponding memory cell, the second ferroelectric capacitor being connected between the drain region and the gate electrode of the field effect transistor of the corresponding memory cell, the source region being connected to a corresponding first wiring, and the drain region being connected to a corresponding second wiring.

By applying write signals to predetermined ones of the first and second wirings, one memory cell can be selected and residual polarization can be generated in the ferroelectric capacitor of the selected memory cell. The directions of this residual polarization are related to data "1" and "1" so that data can be stored. Residual polarization changes the current-voltage characteristics of a field effect transistor. By reading this change, data stored in the memory cell can be discriminated.

As described above, one memory cell can be disposed in an area corresponding to one field effect transistor. It is also possible to access a desired memory cell only by word and bit lines. High integration can therefore be realized.

BRIEF DESCRIPTION OF THE DRAWINGS

FIGS. 19A, 19B, 19C, 19D and 19E are cross sectional views of a substrate illustrating a method of manufacturing a ferroelectric memory device according to a tenth embodiment of the invention.

DETAILED DESCRIPTION OF THE PREFERRED EMBODIMENTS

First, the circuit configuration and operation principle of a ferroelectric memory device according to embodiments of the present invention will be described.

Figure 1A:
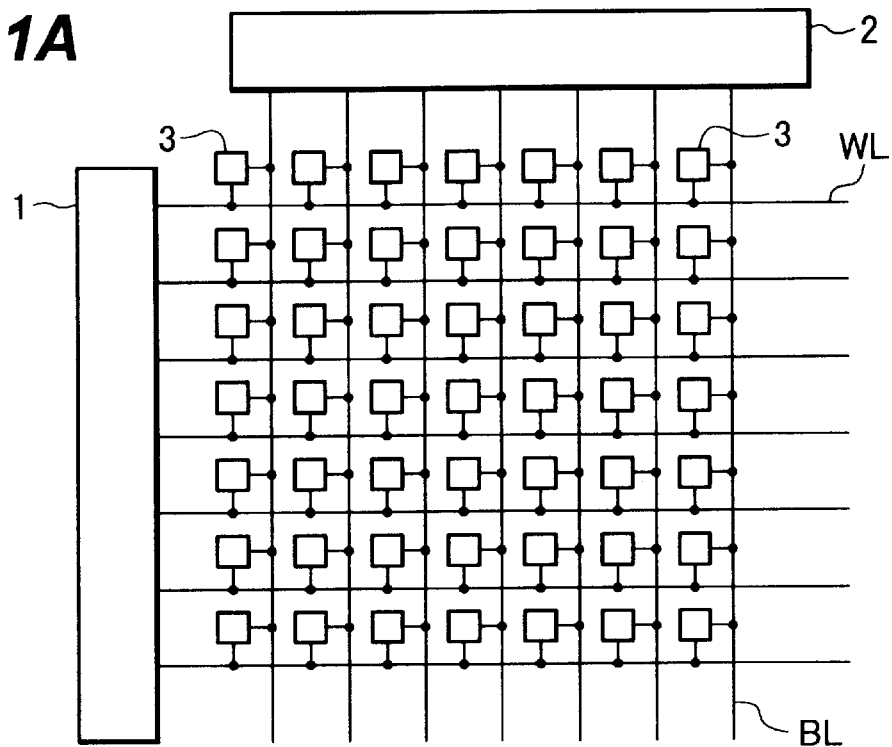
FIG. 1A is a block diagram showing the layout of a ferroelectric memory device according to an embodiment of the invention.

FIG. 1A shows the layout of a cell array of a ferroelectric memory device according to an embodiment. A plurality of word lines WL disposed in parallel to each other are intersected with a plurality of bit lines BL disposed in parallel to each other. A memory cell 3 is disposed at each cross point between the word lines WL and bit lines BL. Each memory cell 3 is connected to a corresponding word line WL and a corresponding bit line BL. All the word lines WL are connected to a word line control circuit 1, and all the bit lines BL are connected to a bit line control circuit 2.

Figure 1B:
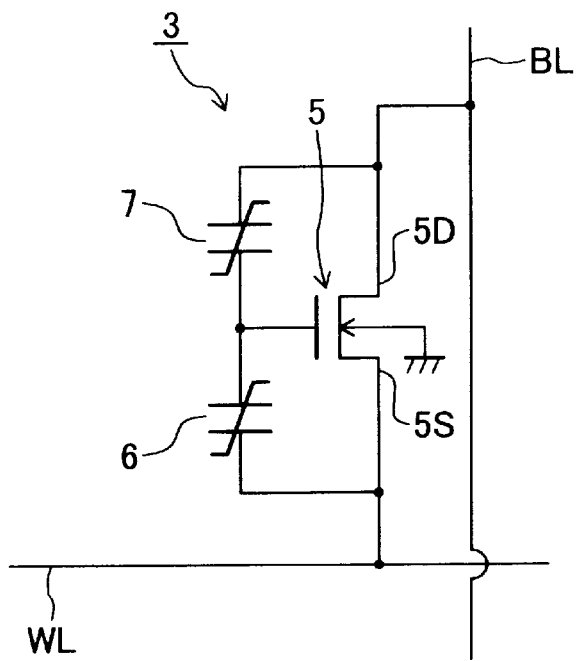
FIG. 1B is an equivalent circuit diagram of one memory cell.

FIG. 1B is an equivalent circuit diagram of one memory cell. Each memory cell 3 is constituted of an n-channel MISFET 5, a first capacitor 6, and a second capacitor 7. A source region 5S and a drain region 5D of MISFET 5 are connected respectively to a corresponding word line WL and a corresponding bit line BL. A ground potential is applied to a channel region of MISFET 5. The channel region of MISFET 5 may be connected to the source region 5S.

The first and second capacitors 6 and 7 are ferroelectric capacitors. The first capacitor 6 connects together a gate electrode 5G and source region 5S of MISFET 5, and the second capacitor 7 connects together the gate electrode 5G and drain electrode 5D.

In this specification, of the source and drain regions of MISFET 5, the region connected to the word line WL is called source region 5S, and the region connected to the bit line BL is called drain region 5D. However, it is not necessary to give definite distinction between the source and drain regions. The region connected to the word line WL may be called drain region, and the region connected to the bit line BL may be called source region.

Next, with reference to FIGS. 2A to 2D a method of writing data "1" or "0" in each memory cell will be described. In FIGS. 2A to 2D, MISFET 5 is represented by a MIS capacitor 5C constituted of the channel and gate electrode 5G.

Figure 2A:
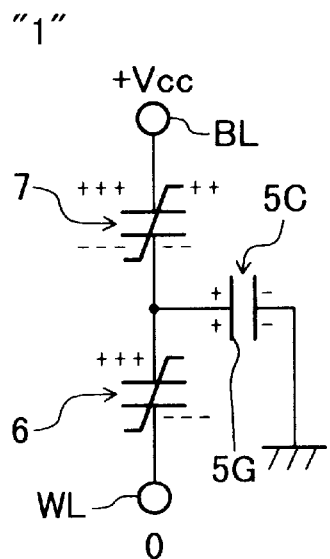
FIGS. 2A, 2B, 2C and 2D are equivalent circuit diagrams of one memory cell illustrating a method of writing and storing data in a ferroelectric memory device according to an embodiment of the invention.

FIG. 2A illustrates a write state of data "1". A ground potential 0 V is applied to the word line WL, and a voltage Vcc is applied to the bit line BL. A MIS capacitor 5C is connected in parallel to the first capacitor 6. Therefore, the second capacitor 7 stores charges corresponding to a sum of charges stored in the first capacitor 6 and MIS capacitor 5C. Ferroelectric films of the first and second capacitors 6 and 7 are polarized in amount corresponding to stored charges.

The word lines WL and bit lines BL not selected during data write are applied with, for example, a voltage Vcc/2. This voltage Vcc/2 has approximately a value which cannot reverse the direction of residual polarization in the ferroelectric films of the first and second capacitors 6 and 7. Therefore, the data "1" can be selectively written in one memory cell by using only the word line WL and bit line BL.

Figure 2B:
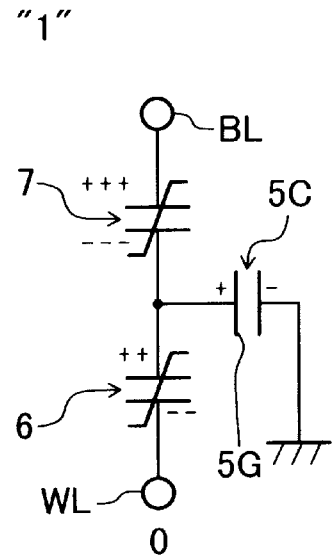

FIG. 2B illustrates a store state of data "1". The ground potential 0 V is applied to the bit line BL and word line WL. Residual polarization is left in the ferroelectric films of the first and second capacitors 6 and 7. The degree of the residual polarization in the first capacitor 6 is different from that in the second capacitor 7. Charges corresponding to the residual polarization are left in the first and second capacitors 6 and 7. Charges corresponding to a difference between charges left in the first and second capacitors 6 and 7 are left in the MIS capacitor 5C. Namely, positive charges are left in the gate electrode 5G. In the channel region, holes move to a deep region of the substrate and the substrate surface is in a depleted state. Therefore, if a small positive voltage is applied to the gate electrode 5G, electrons are accumulated in the channel region which is therefore made conductive.

Figure 2C:
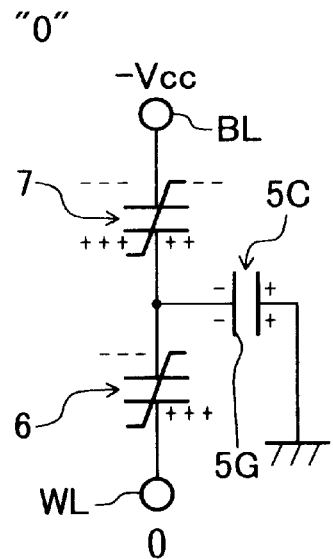
Figure 2D:
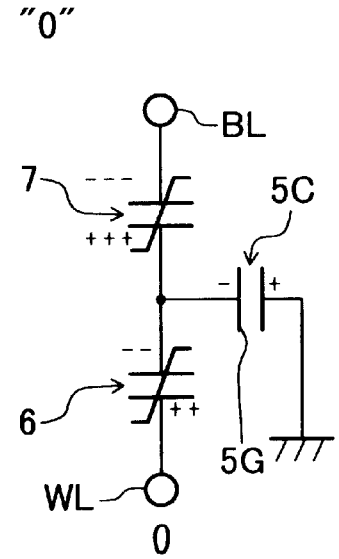

FIGS. 2C and 2D illustrate a write state and a store state of data "0", respectively. When data "0" is written, a negative voltage (−Vcc) is applied to the bit line BL. Each capacitor is charged in opposite directions to those of the charge state shown in FIG. 2A. If the bit line BL is applied with the ground potential, negative charges are left in the gate electrode 5G and holes are accumulated in the channel region. Therefore, in order to make the channel region conductive, it is necessary to apply a large voltage to the gate electrode 5G.

The word lines WL and bit lines BL not selected during data write are applied with, for example, a voltage (−Vcc/2). It is therefore possible to selectively write data "0" in one memory cell by using only the word line WL and bit line BL.

Figure 3:
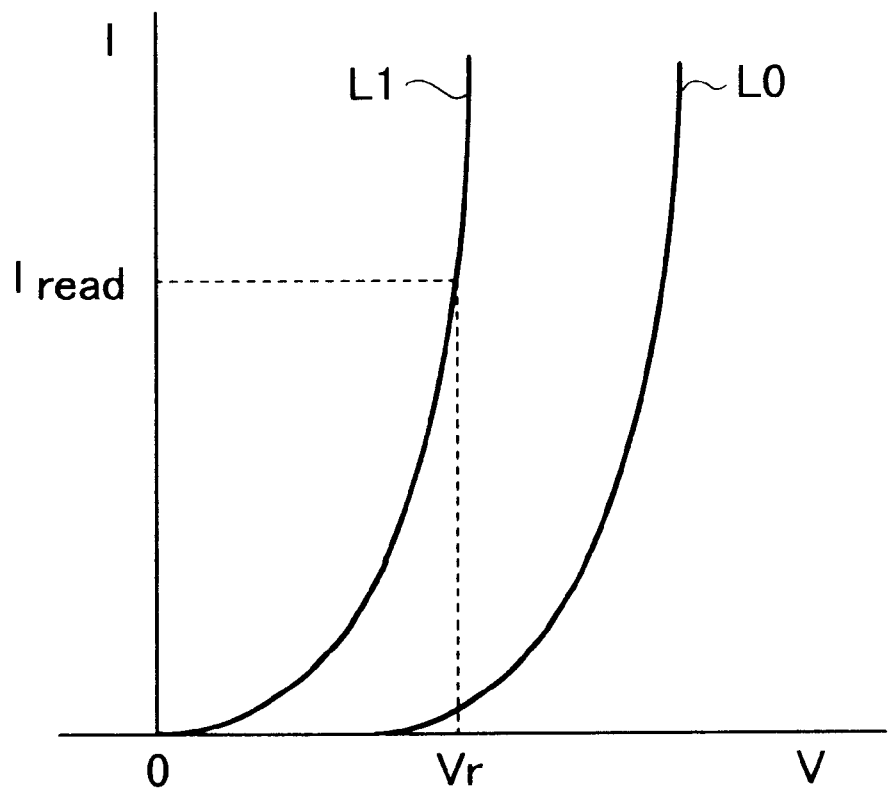
FIG. 3 is a current-voltage characteristic graph of one memory cell illustrating a method of reading data from a ferroelectric memory device according to an embodiment of the invention.

FIG. 3 is a current-voltage characteristic graph of MISFET 5. The abscissa represents a gate voltage on the gate electrode 5G, and the ordinate represents a current flowing through MISFET 5. A curve L1 shown in FIG. 3 corresponds to the state shown in FIG. 2B, i.e., the current-voltage characteristics while the data "1" is stored, and a curve L2 in FIG. 3 corresponds to the state shown in FIG. 2D, i.e., the current-voltage characteristics while the data "0" is stored.

If the data "1" is stored and the gate voltage is Vr, a drain current Iread flows. In contrast, if the data "0" is stored and the gate voltage is Vr, the drain current flows hardly. In accordance with this current difference, the stored data can be read. For example, this current at each word line WL can be detected by the word control circuit 1 shown in FIG. 1A. In order to apply the voltage Vr to the gate electrode, the word line WL is applied with the ground potential and the bit line BL is applied with a voltage of about 2 Vr.

Next, the first embodiment of the invention will be described with reference to FIGS. 4A to 4D.

Figure 4A:
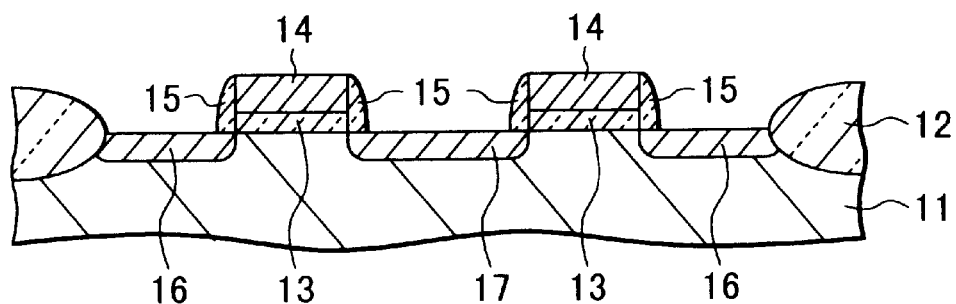
FIGS. 4A, 4B, 4C and 4D are cross sectional views of a substrate illustrating a method of manufacturing a ferroelectric memory device according to a first embodiment of the invention.

Processes of forming the substrate shown in FIG. 4A will be described. The surface of a p-type silicon substrate 11 is selectively oxidized to form a field oxide film 12 which defines active regions. On the surface of the active region, an $SiO_2$ film having a thickness of 10 nm is formed through thermal oxidation. On this $SiO_2$ film, a Ti film of 30 nm in thickness and a Pt film of 20 nm in thickness are laminated through sputtering. The Ti film functions as an adhesion layer. The thickness of the Ti film may be set to 5 to 50 nm and the thickness of the Pt film may be set to 100 to 300 nm.

The Pt, Ti, and $SiO_2$ films are patterned to leave a gate insulating film 13 and a gate electrode 14. This patterning is performed by reactive ion etching (RIE) using $CF_4$ and Ar.

After an $SiO_2$ film is deposited over the whole substrate surface, anisotropic etching is performed to leave side wall insulating films on the side walls of the gate insulating film 13 and gate electrode 14. An n-type source region 16 and a p-type drain region 17 are formed by doping n-type impurities such as P through diffusion or the like. In this embodiment, although adjacent MISFET's share the drain region 17, this layout is not necessarily required.

Processes of forming the substrate shown in FIG. 4B will be described. Alkoxide solution mixed with powders of Sr, Bi, and Ta is coated on the substrate surface. After this coating, the substrate is dried at a temperature of 250° C. The process of coating and drying is repeated four times, and thereafter a heat treatment in an oxygen atmosphere at a temperature of 800° is performed for 30 minutes. With this heat treatment, an $SiBi_2Ta_2O_9$ (SBT) film having a thickness of 200 nm is obtained. The thickness of the SBT film may be set to 50 to 500 nm.

This SBT film is patterned to leave a ferroelectric film 18 covering the gate electrode 14. Patterning the SBT film may be performed by RIE using a mixed gas of $CF_4$ and Ar.

Processes of forming the substrate shown in FIG. 4C will be described. An $IrO_2$ film of 50 nm in thickness and a Pt film of 100 nm in thickness are deposited over the whole surface of the substrate by sputtering. The thickness of the $IrO_2$ film may be set to 10 to 100 nm and the thickness of the Pt film may be set to 50 to 500 nm. The $IrO_2$ film functions as a diffusion preventing layer. The lamination of the $IrO_2$ film and Pt film is patterned to leave a word line 19. The word line 19 covers the source region 16 and approximately a half surface area of the ferroelectric film 18 on the source region side. The word line 19 extends along a direction perpendicular to the drawing sheet of FIG. 4C.

Processes of forming the substrate shown in FIG. 4D will be described.

An $SiO_2$ film is deposited over the whole surface of the substrate by chemical vapor deposition (CVD). The $SiO_2$ film is patterned to expose the surface of the ferroelectric film 18 not covered with the word line 19 and the surface of the drain region 17, and to leave an interlayer insulating film 20 covering the word line 19.

An $IrO_2$ film of 50 nm in thickness and a Pt film of 100 nm in thickness are deposited over the whole surface of the substrate. The lamination structure of the $IrO_2$ film and Pt film is patterned to leave a bit line 21. The bit line 21 covers the surface of the drain region 17 and approximately a half surface area of the discrimination value extracting circuit 202 film 18 on the drain region 17 side, and extends along a direction intersecting the word line 19.

The gate electrode 14, ferroelectric film 18, and word line 19 constitute the first capacitor 6 shown in FIG. 1B, and the gate electrode 14, ferroelectric film 18, and bit line 21 constitute the second capacitor 7.

Figure 5:
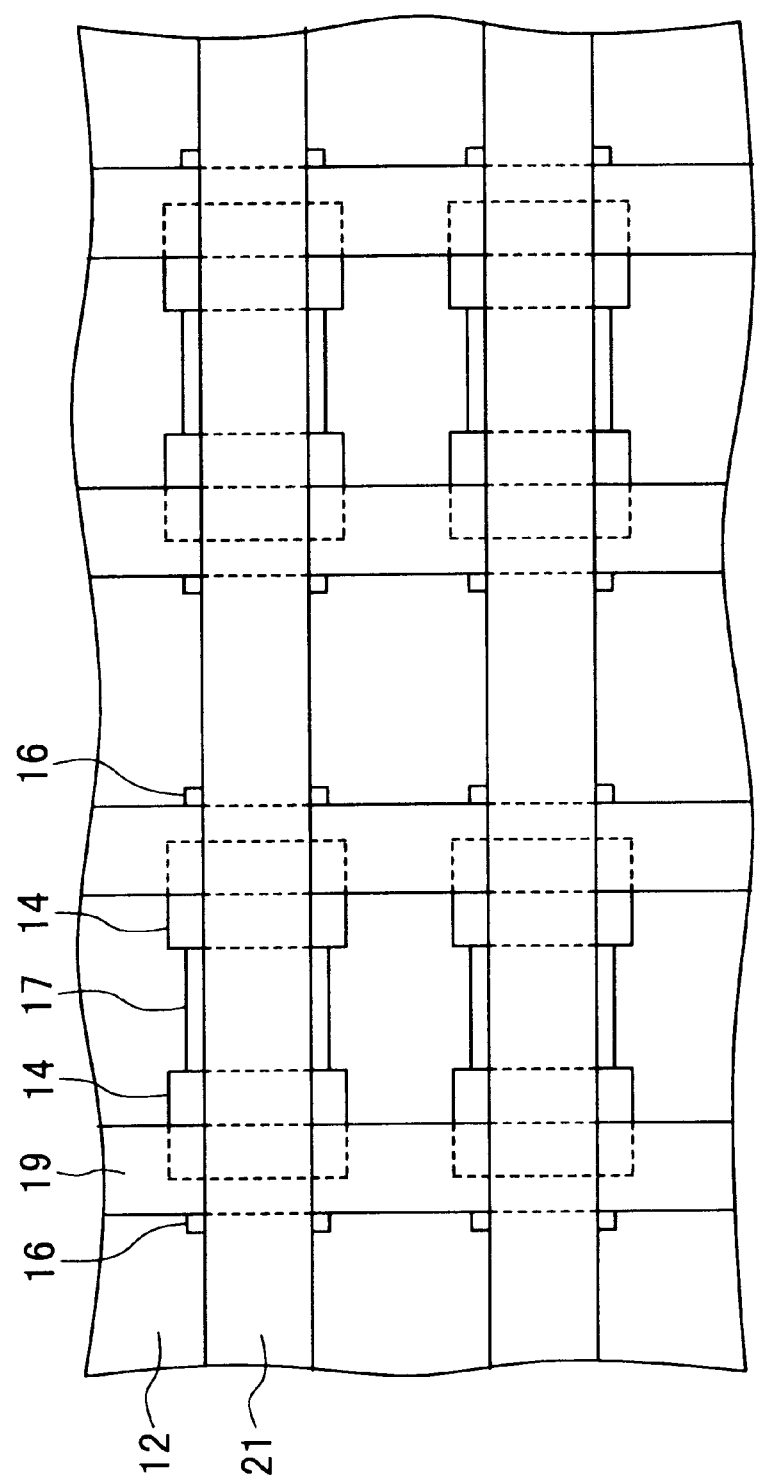
FIG. 5 is a plan view of a ferroelectric memory device of the first embodiment.

FIG. 5 is a plan view of the ferroelectric memory device of the first embodiment. The field oxide film 12 defines active regions distributed in a matrix shape. Two word lines 19 are disposed in each column of active regions, and one bit line 21 is disposed in each row. The gate electrode 14 is disposed at each cross point between the word lines 19 and bit lines 21. In FIG. 5, in order to clearly show the position of the source region 16, the source region 16 is shown extending out of the word line 19.

Figure 4B:
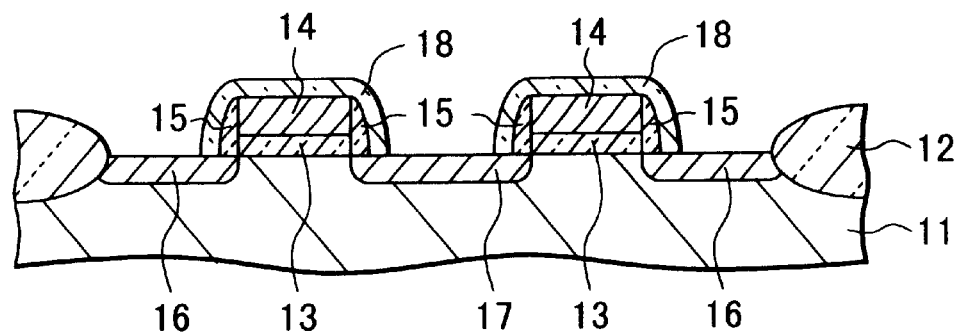
Figure 4C:
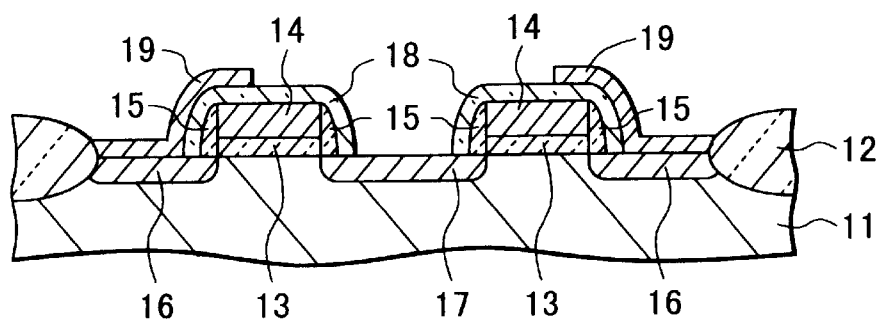
Figure 4D:
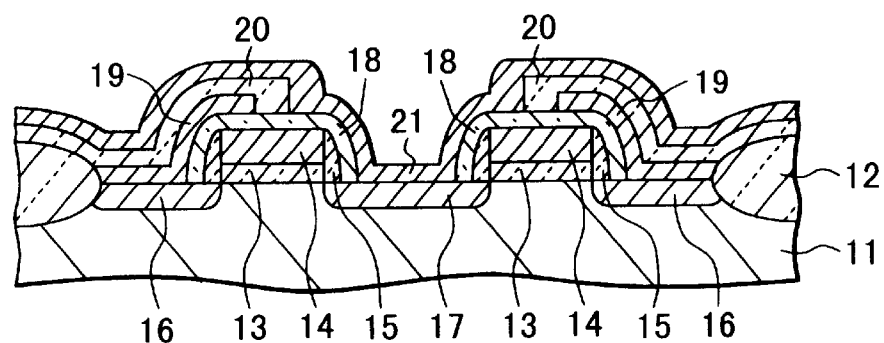

In the ferroelectric memory device of the first embodiment, as shown in FIG. 4D, the ferroelectric capacitor is formed by using the ferroelectric film 18 covering the gate electrode 14. Namely, one memory is substantially formed only by one transistor. It is therefore possible to reduce an area occupied by one memory cell more than a conventional FeRAM of 2Tr-2C type, and high integration is possible.

It is also possible to randomly access an arbitrary memory cell by using only two types of bus lines, the word line 19 and bit line 21. A memory drive method can therefore be simplified. A source line necessary for a conventional FeRAM of 1Tr-1C type is not required so that high integration can be effectively realized.

Next, with reference to FIG. 6 the second embodiment of the invention will be described.

Figure 6:
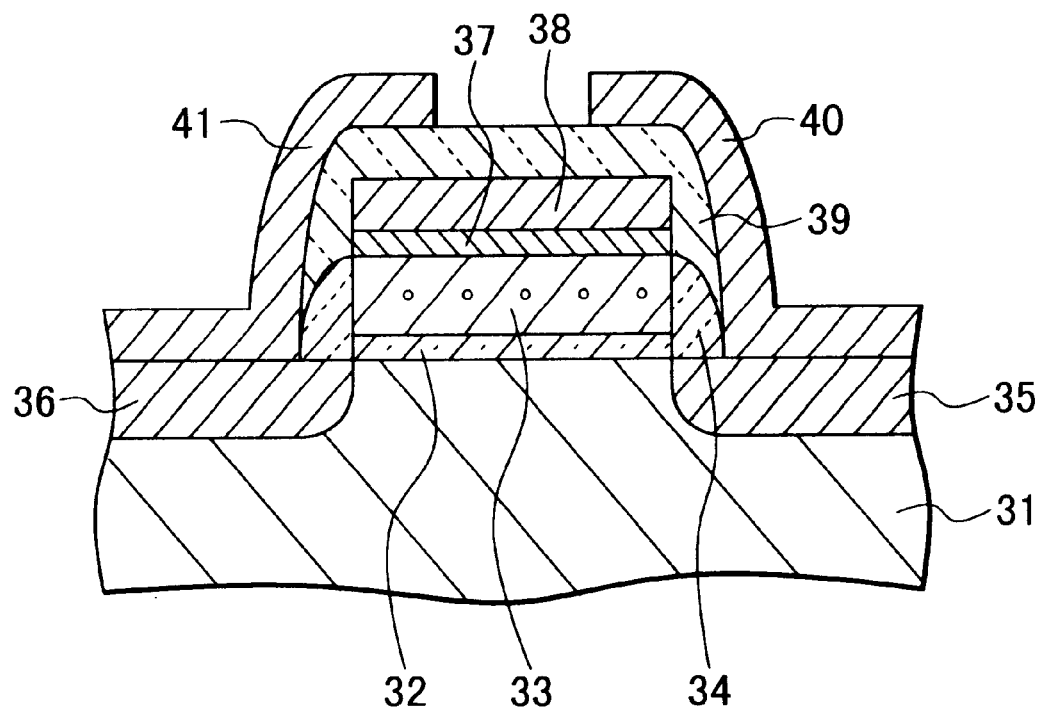
FIG. 6 is a cross sectional view of one memory cell of a ferroelectric memory device according to a second embodiment of the invention.

FIG. 6 is a plan view of a ferroelectric memory device of the second embodiment. The surface of a p-type silicon substrate 31 is selectively oxidized to form a field oxide film (not shown). The surface of an active region defined by the field oxide film is thermally oxidized to form an $SiO_2$ film of 10 nm in thickness. On this $SiO_2$ film, a polysilicon film is deposited to a thickness of 180 nm by CVD. The thickness of the polysilicon film may be set to 100 to 500 nm.

The lamination structure of the $SiO_2$ film and polysilicon film is patterned to leave a gate insulating film 32 and a polysilicon electrode 33. At this time, the gate electrode of MISFET is formed in the peripheral circuit area.

After an $SiO_2$ film is deposited over the whole surface of the substrate, anisotropic etching is performed to leave side wall insulating films 34 on the side walls of the gate electrode. Next, an n-type drain region 35 and a p-type source region 36 are formed by doping n-type impurities such as P through diffusion or the like. Similar to the first embodiment shown in FIG. 4D, the drain region 35 may be disposed so that adjacent two MISFET's share the drain region.

A TiN film of 50 nm in thickness and a Pt film of 100 nm in thickness are deposited over the whole surface of the substrate through sputtering. The thickness of the TiN film may be set to 20 to 100 nm and the thickness of the Pt film may be set to 50 to 500 nm. The lamination structure of the TiN film and Pt film is patterned to leave a gate electrode made of a TiN film 37 and a Pt film 38 on the polysilicon gate electrode 33. The TiN film functions as a diffusion preventing layer. Etching the TiN film and Pt film may be performed by RIE using a mixed gas of $CF_4$ and Ar. With a method similar to the first embodiment described with reference to FIG. 4B, a ferroelectric film 39 is formed covering the gate electrode 37, 38.

An $IrO_2$ film of 50 nm in thickness and a Pt film of 100 nm in thickness are deposited over the whole surface of the substrate. The $IrO_2$ film and Pt film are patterned to leave a word line 41 and bit line interconnect electrode 40. The word line 41 has a shape similar to the word line 19 of the first embodiment shown in FIG. 4D.

The bit line interconnect electrode 40 covers the surface of the drain region 35 and approximately a half surface of the ferroelectric film 39 on the drain region 35 side. The bit line interconnect electrode 40 is connected to a bit line formed in an unrepresented upper wiring layer. The structure similar to that of the word line 19, interlayer insulating film 20, and bit line 21 of the first embodiment shown in FIG. 4D may be utilized.

In the second embodiment, the underlying layer of the gate electrode is made of polysilicon. Therefore, the processes up to the process of forming the source and drain regions can be used in common with MISFET in the peripheral circuit area.

The TiN film shown in FIG. 6 prevents alloy reaction between the polysilicon gate electrode 33 and Pt film 38. By preventing the alloy reaction, it is possible to prevent the surface of the Pt film from becoming uneven. The TiN film is not necessarily required, but in some cases, the Pt film 38 may be formed directly on the polysilicon gate electrode 33.

Next, with reference to FIG. 7 the third embodiment will be described.

Figure 7:
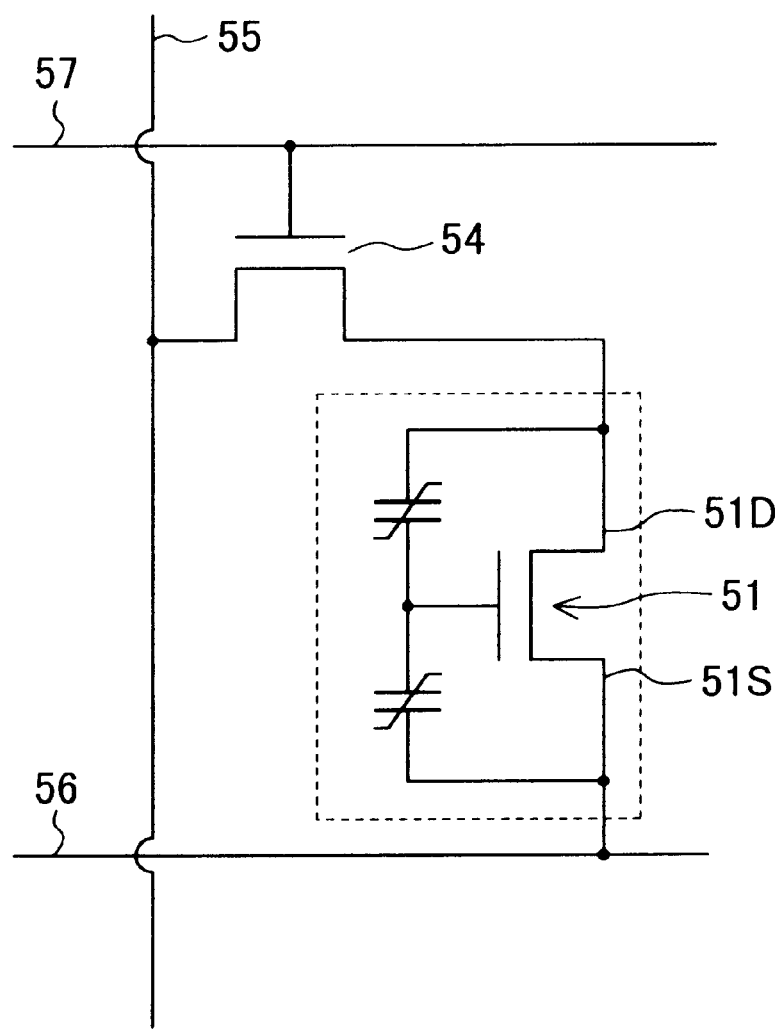
FIG. 7 is an equivalent circuit of one memory cell of a ferroelectric memory device according to a third embodiment of the invention.

FIG. 7 is an equivalent circuit diagram of a memory cell of a ferroelectric memory device according to the third embodiment. In the ferroelectric memory device shown in FIG. 1B, the drain region 5D of MISFET 5 constituting the memory cell is directly connected to a corresponding bit line BL. In contrast, in the third embodiment, as shown in FIG. 7 the drain region 51D of a MISFET 51 is connected via a switching transistor 54 to a corresponding bit line 55. The source region 51S is connected to a corresponding word line 56.

A gate electrode of the switching transistor 54 is connected to a switching control line 57 which extends in parallel to the word line 56. In accordance with a signal applied to the switching control line 57, the conduction state of the switching transistor 54 is controlled. By providing the switching transistor 54, disturbance of a non-selected memory cell during data write can be prevented.

The gate electrode of the switching transistor 54 is preferably made of polysilicon similar to the second embodiment shown in FIG. 6.

In the first and second embodiments, the side wall insulating films 15 or 34 are formed on the side walls of the gate electrode. These side walls are not necessarily required, but the ferroelectric film 18 or 39 may be in direct contact with the side walls of the gate electrode.

In the first embodiment, as shown in FIG. 4B the ferroelectric film 18 does not cover the source region 16 and drain region 17. Also in the second embodiment, the ferroelectric film 39 does not cover the source region 36 and drain region 35. Instead, these ferroelectric films may cover the source and drain regions. In this case, contact holes are formed through the ferroelectric film on the source and drain regions. The source region and word line are connected via the contact hole and the drain region and bit line are connected via the other contact hole.

In the first and second embodiments, although the source and drain regions of MISFET have a simple structure, a lightly doped drain (LDD) structure may be incorporated.

Also in the above embodiments, the word and bit lines each have the two-layer structure of a Pt layer and an $IrO_2$ layer. The $IrO_2$ layer directly contacts the ferroelectric layer and functions as a diffusion preventing layer and an adhesion layer. In place of the $IrO_2$ layer, other noble metal oxide films such as a $RuO_2$ layer and a $RhO_2$ layer may be used. The Pt layer may be made of pure Pt or Pt alloy containing Ir, Rh, Ru or the like.

In the above embodiments, although the ferroelectric film is made of SBT, other ferroelectric materials may be used. One example of ferroelectric materials is Bi-containing laminar perovskite oxide which is expressed by a general formula:

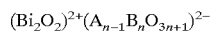

where A is Bi. Pb, Ba, Sr, Ca, Na or K, B is Ti, Ta, Nb, W, Mo, Fe, Co, or Cr, and n is an integer 1 to 5. In particular, A may be Sr and B may be mixed crystal of Ta and Nb. SBT in the above general formula corresponds to A=Sr, B=Ta, and n=2.

Other ferroelectric materials may be strontium titanate (ST), barium strontium titanate (BST), lead zirconate titanate (PZT), lead lanthanum zirconate titanate (PLZT) or the like. If Bi-containing laminar perovskite oxide such as SBT is used, an S/N ratio can be made large although the switching charge amount $S_{SW}$ of a ferroelectric capacitor becomes large. If PZT or the like is used, the switching charge amount $S_{SW}$ can be made large.

In the first and second embodiments, it is preferable that the electrostatic capacitances of the first and second capacitors 6 and 7 shown in FIG. 1B are made equal. If the capacitances are made equal, the two ferroelectric capacitors are deteriorated equally as the ferroelectric films are deteriorated. It is therefore possible to maintain a stable memory operation.

Next, with reference to FIGS. 8 and 9, the fourth embodiment will be described.

Figure 8:
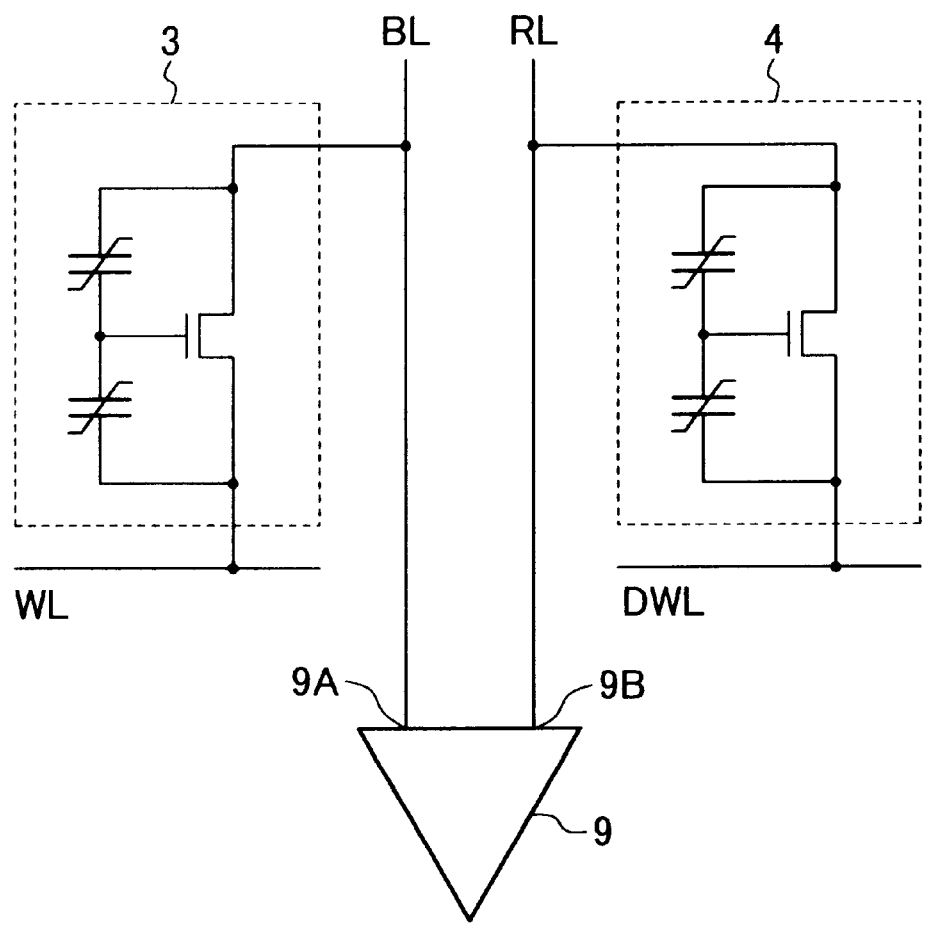
FIG. 8 is an equivalent circuit of one memory cell and one dummy cell of a ferroelectric memory device according to a fourth embodiment of the invention.

FIG. 8 is an equivalent circuit diagram showing the main part of a ferroelectric memory device of the fourth embodiment. A memory cell 3, a word line WL, and a bit line BL are the same as those of the first embodiment shown in FIG. 1B. In the fourth embodiment, in addition to the memory cell 3, a dummy cell 4 is provided. The fundamental circuit structure of the dummy cell 4 is the same as that of the memory cell 3. However, the gate width of MISFET of the dummy cell 4 is made narrower than that of MISFET of the memory cell 3. For example, the gate width of MISFET of the dummy cell 4 is set to a half of the gate width of MISFET Of the memory cell 3. The source region of MISFET of the dummy cell 4 is connected to a dummy word line DWL, and the drain region is connected to a reference line RL.

The bit line BL is connected to one current detection terminal 9A of a sense amplifier 9, and the reference line RL is connected to the other current detection terminal 9B of the sense amplifier 9. The sense amplifier 9 applies a voltage to the current detection terminals 9A and 9B and detects a difference of currents flowing through the current detection terminals 9A and 9B.

Figure 9:
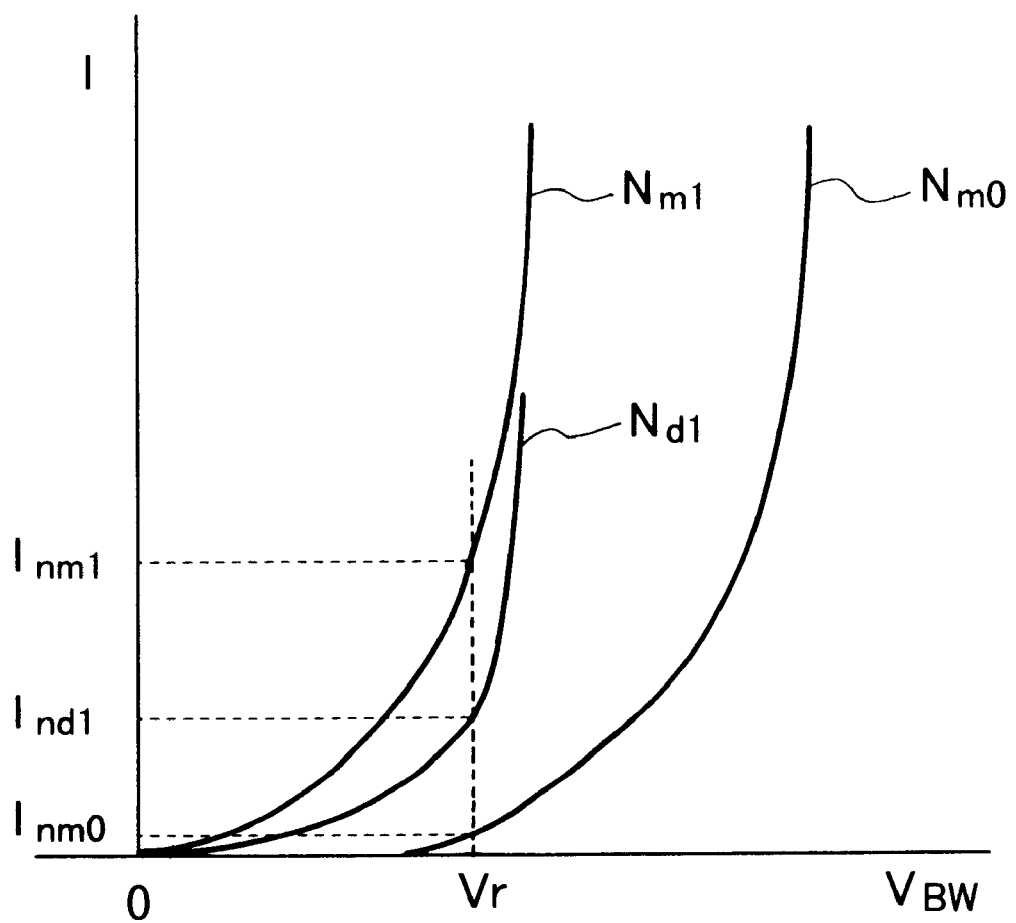
FIG. 9 is a current-voltage characteristic graph of one memory cell and one dummy cell illustrating a method of reading data from the ferroelectric memory device of the fourth embodiment.

FIG. 9 is a current-voltage characteristic graph of the memory cell 3 and dummy cell 4 shown in FIG. 8. The abscissa represents a voltage between the bit line BL and word line WL and a voltage between the dummy word line DWL and reference line RL. The ordinate represents a current flowing through the memory cell 3 and dummy cell 4.

A curve $N_{m1}$ shown in FIG. 9 indicates the characteristics of the state that data "1" is stored in the memory cell 3, a curve $N_{m0}$ indicates the characteristics of the state that data "0" is stored in the memory cell 3, and a curve $N_{d1}$ indicates the characteristics of the state that data "1" is stored in the dummy cell 4. Since the gate width of MISFET of the dummy cell 4 is about a half of that of MISFET of the memory cell 3, a current (corresponding to the curve $N_{d1}$) flowing through the dummy cell 4 while the data "1" is stored, is about a half of the current (corresponding to the curve $N_{m1}$) flowing through the memory cell while the data "1" is stored.

Next, with reference to FIGS. 8 and 9, a method of reading data stored in the memory cell 3 will be described. A ground potential is applied to the word line WL and dummy word line DWL, and a voltage Vr is applied to the two current detection terminals 9A and 9B of the sense amplifier 9. The currents shown by the curves $N_{m1}$, $N_{d1}$, and $N_{m0}$ when the voltage Vr is applied are $I_{nm1}$, $I_{nd1}$, and $I_{nm0}$, respectively. The voltage Vr satisfies the condition formula of $I_{nm1} > I_{nd1} > I_{nm0}$.

The sense amplifier 9 compares the current flowing through the current detection terminal 9A with the current flowing through the current detection terminal 9B. If data "1" is stored in the memory cell 3, the current $I_{nm1}$ flows through the current detection terminal 9A and the current $I_{nd1}$ flows through the current detection terminal 9B. Namely, a larger current flows through the current detection terminal 9A than through the current detection terminal 9B. If data "0" is stored in the memory cell 3, the current $I_{nm0}$ flows through the current detection terminal 9A and the current $I_{nd1}$ flows through the current detection terminal 9B. Namely, a smaller current flows through the current detection terminal 9A than through the current detection terminal 9B.

Therefore, by comparing the two currents flowing through the two current detection terminals 9A and 9B, data stored in the memory cell 3 can be discriminated. It is therefore possible to stably read data.

In the third embodiment, the gate width of MISFET of the dummy cell is made narrower than that of MISFET of the memory cell 3. In stead of changing the gate width, the gate length of MISFET of the dummy cell 4 may be made longer than that of MISFET of the memory cell 3. For example, the gate length of MISFET of the dummy cell 4 may be set to a twofold of the gate length of MISFET of the memory cell 3. As above, by setting the resistance value of MISFET of the dummy cell 4 during the conductive state larger than that of MISFET of the memory cell 3, the current-voltage characteristics shown in FIG. 9 can be obtained.

Figure 10:
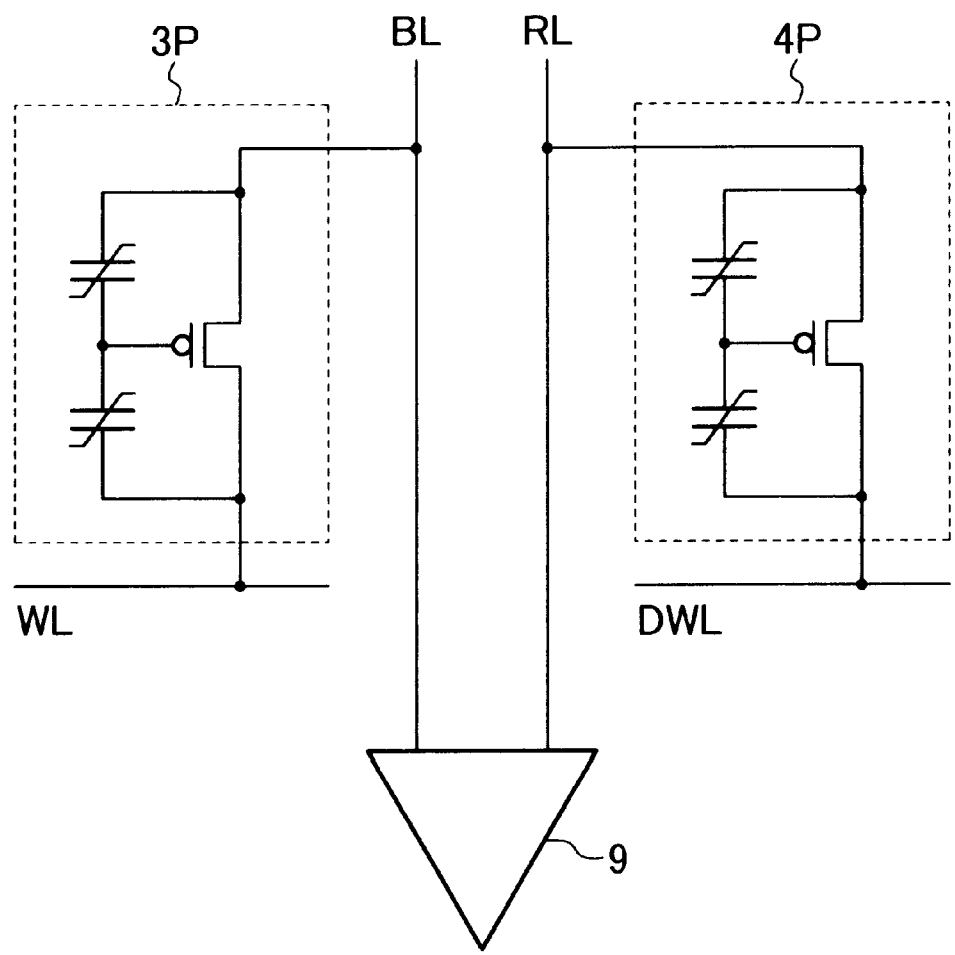
FIG. 10 is an equivalent circuit of one memory cell and one dummy cell of a ferroelectric memory device according to a fifth embodiment of the invention.

FIG. 10 is an equivalent circuit diagram of the main part of a ferroelectric memory device according to the fifth embodiment of the invention. In the fourth embodiment shown in FIG. 8, MISFET's of the memory cell 3 and dummy cell 4 are n-channel. In the fifth embodiment, MISFET's of a memory cell 3P and a dummy cell 4P are p-channel. The gate width of a p-channel MISFET of the dummy cell 4P is about a half of the gate width of MISFET of the memory cell 3P, similar to the fourth embodiment. The other structures are similar to those of the fourth embodiment shown in FIG. 8.

When data "1" is written in the memory cell 3P, a ground potential is applied to the word line WL, and a write voltage Vcc is applied to the bit line BL. When data "0" is written in the memory cell 3P, the ground potential is applied to the bit line BL, and the write voltage Vcc is applied to the word line WL. The data "0" is written in the dummy cell 4P.

Figure 11:
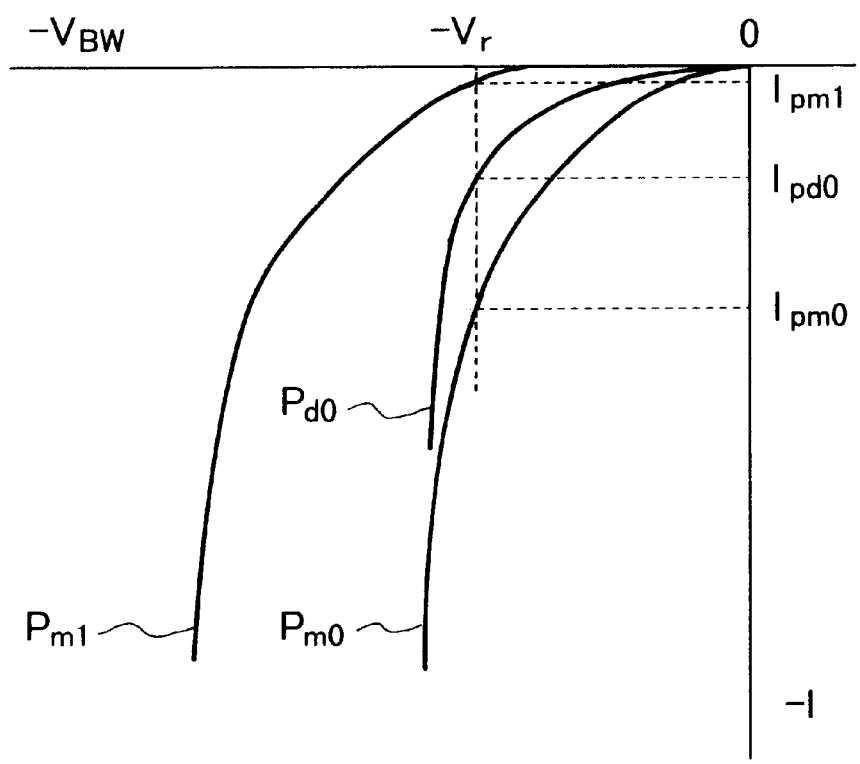
FIG. 11 is a current-voltage characteristic graph of one memory cell and one dummy cell illustrating a method of reading data from the ferroelectric memory device of the fifth embodiment.

FIG. 11 is a current-voltage characteristic graph of the memory cell 3P and dummy cell 4P. The graph of FIG. 11 is similar to that of the graph shown in FIG. 9 with the signs of voltage and current being inverted. Namely, when a voltage $(-Vr)$ is applied between the bit line BL and word line WL and between the reference line RL and dummy word line DWL, a current $(-I_{pm1})$ or $(-I_{pm0})$ flows through the memory cell 3P and a current $(-I_{pd0})$ flows through the dummy cell 4P. These currents satisfy a relation of $(-I_{pm1}) > (-I_{pm}) > (-I_{pd0})$. Therefore, similar to the fourth embodiment, data stored in the memory cell 3P can be read stably.

Next, with reference to FIGS. 12A to 12D, a method of manufacturing a ferroelectric memory device according to the sixth embodiment of the invention will be described.

Processes of forming the substrate shown in FIG. 12A will be described. On the surface of a p-type silicon substrate 60, an element separation structure 61 is formed. For example, the element separation structure 61 may be a field oxide film formed by using local oxidation of silicon (LOCOS) techniques, or a shallow trench. On the surface of an active region defined by the element separation structure 61, a gate insulating film 5I having a thickness of 10 nm is formed through thermal oxidation.

On the gate insulating film 5I, a Ti film 5G1 of 30 nm in thickness and a Pt film 5G2 of 200 nm in thickness are laminated in this order. The Ti film 5G1 and Pt film 5G2 may be deposited by sputtering. The Ti film 5G1 has a function of improving adhesion between the gate insulating film 5I and Pt film 5G2.

The Pt film 5G2, Ti film 5G1, and gate insulating film 5I are patterned to form a gate electrode 5G. Etching the Pt film 5G2 and Ti film 5G1 may be performed by reactive ion etching (RIE) using a mixed gas of $CF_4$ and Ar.

An ion incidence angle of RIE is initially set to about 20°, and thereafter it is set to 60°. By controlling the ion incidence angle in this manner, it is possible to prevent resist from remaining along the upper surface peripheral of the gate electrode 5G in a fence-like shape.

Side wall insulating films 65 of $SiO_2$ are formed on the side walls of the gate electrode 5G. The side wall insulating films 65 are formed by depositing an $SiO_2$ film over the whole surface of the substrate and thereafter anisotropically etching it through RIE. By using the gate electrode 5G and side wall insulating films 65 as a mask, phosphorous (P) ions are implanted to form a source region 5S and a drain region 5D.

Figure 12A:
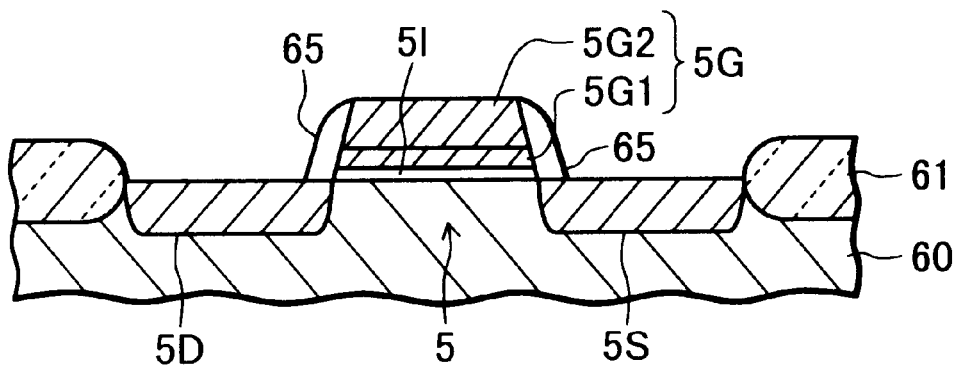
FIGS. 12A to 12D are cross sectional views of a substrate illustrating a method of manufacturing a ferroelectric memory device according to a sixth embodiment of the invention.
Figure 12B:
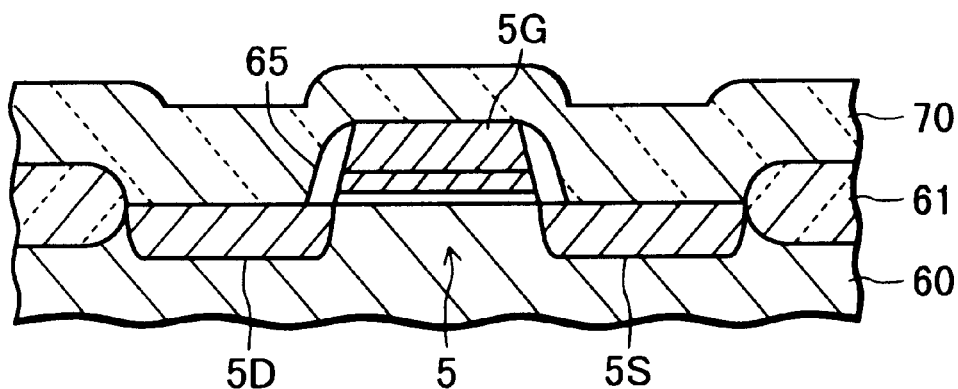

As shown in FIG. 12B, a ferroelectric film 70 of 300 nm thickness made of SBT is formed over the whole surface of the substrate by a sol-gel method. A method of forming the ferroelectric film 70 will be described in the following. Alkoxide solution mixed with powders of Sr, Bi, and Ta is spin-coated on the substrate surface. After this spin-coating, the substrate is dried at a temperature of 250°. The process of spin-coating and drying is repeated four times, and thereafter a heat treatment in an oxygen atmosphere at a temperature of 800° performed for 30 minutes. At this stage, the ferroelectric film 70 is not crystallized. The surface of a thin film formed by the sol-gel method is likely to be planarized. Therefore, the film thickness above the gate electrode 5G becomes thinner than that above the source/drain regions 5S and 5D.

Figure 12C:
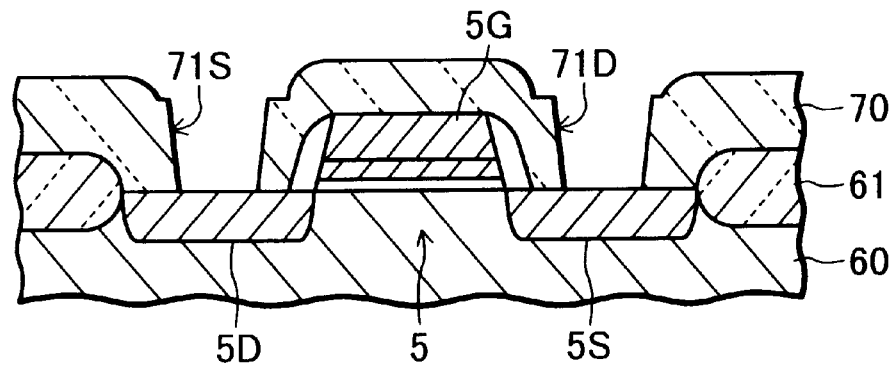

As shown in FIG. 12C, contact holes 71S and 71D are formed through the ferroelectric film 70 to expose partial surface areas of the source region 5S and drain region 5D. Etching the ferroelectric film 70 may be performed by RIE using a mixed gas of $CF_4$ and Ar.

Figure 12D:
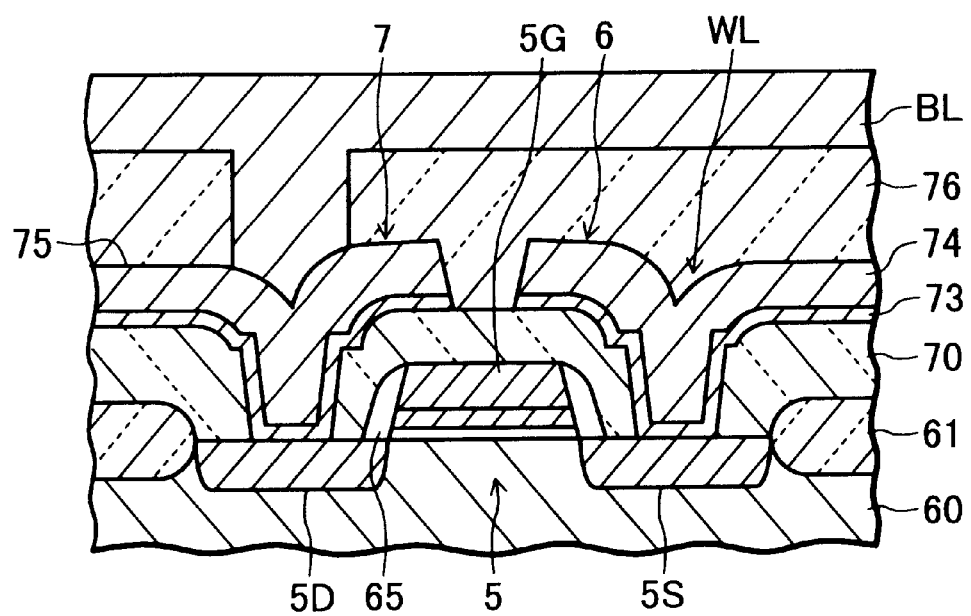

As shown in FIG. 12D, an $IrO_2$ of 50 nm in thickness and a Pt film 74 of 100 nm in thickness are laminated in this order over the whole surface of the substrate. The $IrO_2$ film 73 is deposited by reactive sputtering using a mixed gas of Ar and $O_2$ as a sputtering gas and Ir as a target. The sputtering conditions are a substrate temperature of 300° C., an atmosphere pressure of 5 mTorr, a DC power of 500 W, an Ar flow rate of 40 sccm, and an $O_2$ flow rate of 80 sccm. In this case, as an assist gas for heating the substrate, Ar gas is flowed at 30 sccm in between a substrate holder and the substrate.

The $IrO_2$ film formed under the above conditions was evaluated by X-ray diffraction. A peak corresponding to $IrO_2$ was detected. The cross section of the $IrO_2$ film was observed with a scanning electron microscope (SEM). It was confirmed that grains of $IrO_2$ crystals of a column shape were formed. The $IrO_2$ film 23 functions as a diffusion preventing layer.

The Pt film 74 may be deposited by sputtering and using Ar as a sputtering gas and Pt as a target.

The $IrO_2$ film 73 and Pt film 74 are patterned to separate them into a word line WL connected to the drain region 5D and a drain electrode 75 connected to the drain region 5D. Etching the Pt film 74 and $IrO_2$ film 73 is performed by RIE using a mixed gas of $CF_4$ and Ar.

The drain electrode 75 faces an upper partial surface area of the gate electrode 5G via the ferroelectric film 70. The drain electrode 75, ferroelectric film 70, and gate electrode 5G constitute the second capacitor 7. The word line WL faces an upper partial surface area of the gate electrode 5G via the ferroelectric film 70. The word line WL, ferroelectric film 70, and gate electrode 5G constitute the first capacitor. The word line WL extends along a direction perpendicular to the drawing sheet of FIG. 12D and is connected to the source region of another memory cell 3 shown in FIG. 1A.

After the $IrO_2$ film 73 and Pt film 74 are patterned, a heat treatment is performed to crystallize the ferroelectric film 70. This heat treatment is performed for about 30 minutes in an oxygen atmosphere at a temperature of 750 to 800° C.

An interlayer insulating film 76 is formed covering the word line WL and drain electrode 75. For example, the interlayer insulating film 76 is formed by CVD using tetraethylorthosilicate (TEOS). A contact hole is formed through the interlayer insulating film 76 to expose a partial surface area of the drain electrode 75. A bit line BL is formed on the interlayer insulating film, the bit line BL extending along a direction intersecting the word line WL. For example, the bit line BL is made of Al.

In the ferroelectric memory device shown in FIG. 12D, similar to the first embodiment, one memory cell can be disposed in an area corresponding to approximately one MISFET. A desired memory cell can be accessed by using only the word line WL and bit line BL.

Also in the ferroelectric memory device shown in FIG. 12D, the side wall insulating films 65 are formed on the side walls of the gate electrode 5G. It is therefore possible to reduce leak current between the gate electrode 5G and source region 5S and between the gate electrode 5G and drain region 5D.

Figure 13A:
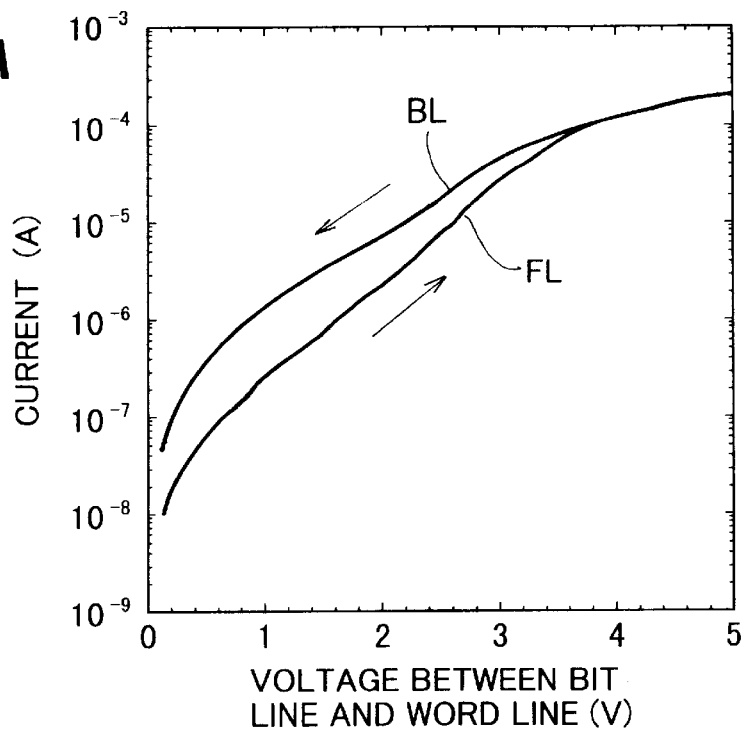
FIG. 13A is a current-voltage characteristic graph obtained by measuring memory cells of the sixth embodiment.

FIG. 13A is a current-voltage characteristic graph of the memory cell shown in FIG. 12D. The abscissa represents a voltage of the bit line relative to the word line WL in the unit of "V", and the ordinate represents a current flowing between the bit line BL and word line WL in the unit of "A". The gate width of MISFET of the memory cell under measurements was 10 $\mu$m and the gate length was 1 $\mu$m. As the voltage is gradually raised, the current gradually increases as indicated by a curve FL.

When the voltage applied to the bit line BL reaches 5 V, the voltage is lowered. As the voltage is gradually lowered, the current gradually reduces as indicated by a curve BL. The current change traces different paths during raising and lowering the voltage, and has hysteresis. This is because the polarization of the ferroelectric film 70 constituting the first and second capacitors 6 and 7 shown in FIG. 12D has the hysteresis characteristics relative to an applied voltage.

Figure 13B:
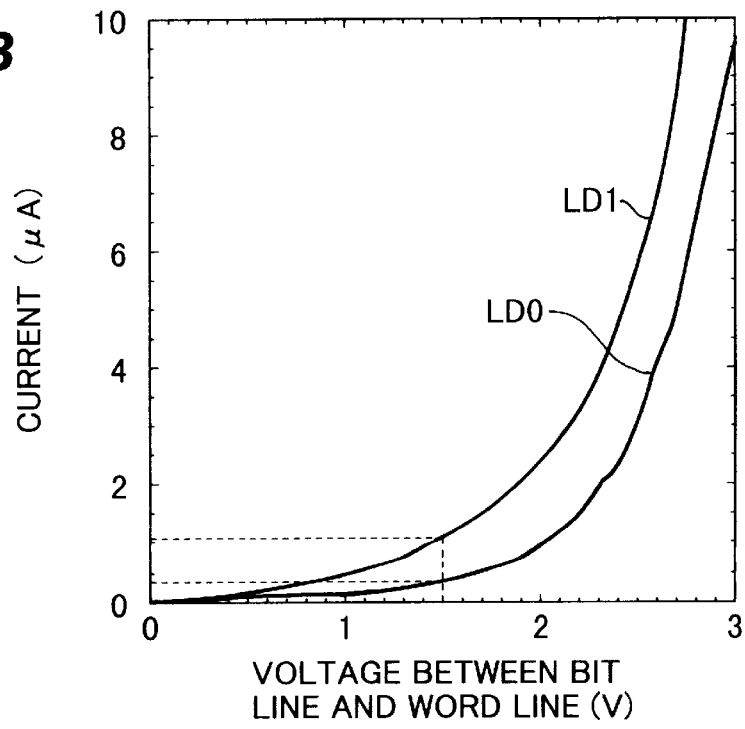
FIG. 13B is a current-voltage characteristic graph obtained by measuring memory cells of the sixth embodiment when data "1" is stored in a memory cell and when data "0" is stored in the memory cell.

FIG. 13B is a current-voltage characteristic graph of a memory cell storing data "1" and a memory cell storing data "0". The abscissa represents a voltage of the bit line BL relative to the word line WL in the unit of "V", and the ordinate represents a current flowing between the bit line BL and word line WL in the unit of "$\mu$A". A curve LD1 shown in FIG. 13B shows a current change in the memory cell which stores data "1" by applying +5 V to the bit line BL, and a curve LD0 shows a current change in the memory cell which stores data "0" by applying −5 V to the bit line BL.

It can be seen from this graph that the current flowing through the memory cell storing the data "1" is larger than that flowing through the memory cell storing the data "0". For example, when a voltage of 1.5 V is applied, a current of about 1 $\mu$A flows through the memory cell storing data "1", whereas a current of only about 0.3 $\mu$A flows through the memory cell storing data "0". By detecting this current difference, data stored in the memory cell can be read.

Figure 14:
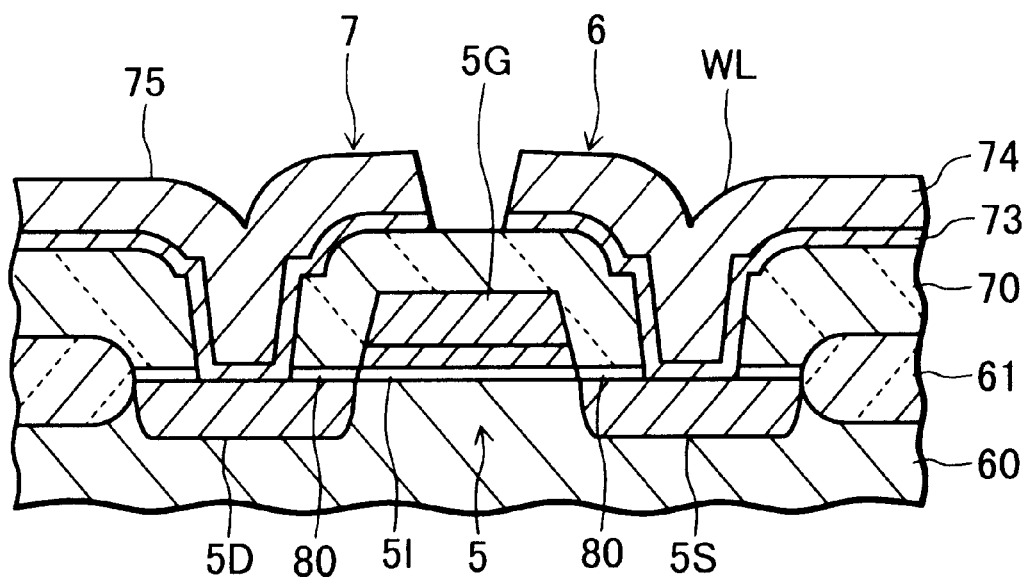
FIG. 14 is a cross sectional view of one memory cell of a ferroelectric memory device according to a seventh embodiment of the invention.

FIG. 14 is a cross sectional view of one memory cell of a ferroelectric memory device according to the seventh embodiment. In the sixth embodiment shown in FIG. 12D, the source/drain regions 5S and 5D directly contact the ferroelectric film 70. In the seventh embodiment, of the surfaces of source/drain regions 5S and 5D, the surface not in contact with the word line WL and drain electrode 75 is covered with a protective insulating film 80 made of $SiO_2$. The side wall insulating films 65 shown in FIG. 12D are not formed in the seventh embodiment. The other structures are similar to those of the sixth embodiment shown in FIG. 12D.

A method of forming the protective insulating film 80 will be described in the following. After ion implantation is performed for forming the source/drain regions 5S and 5D shown in FIG. 12A, the natural oxide films on the surfaces of the source/drain regions 5S and 5D are removed. Thereafter, the substrate surface is thermally oxidized so that the surfaces of the source/drain regions 5S and 5D can be covered with the protective insulating films 80. As shown in FIG. 12A, the side wall insulating films 65 may be formed prior to the ion implantation.

Alternatively, the Ti film 5G1 shown in FIG. 12A may be etched under the condition of a larger etching selection ratio of Ti to $SiO_2$ to leave the gate insulating film 5I on the surfaces of the source/drain regions 5S and 5D. For example, the Ti film is etched by RIE using a mixed gas of $Cl_4$ and $BCl_3$. This etching condition provides a Ti etching selection ratio of about 10 of Ti to $SiO_2$. The Pt film 5G2 on the Ti film 5G1 is etched by RIE using a mixed gas of $CF_4$ and Ar.

In the seventh embodiment, the surfaces of the source/ drain regions 5S and 5D are covered with the protective insulating films 80. It is therefore possible to reduce leak current between the source/drain region 5S or 5D and ferroelectric film 70.

Figure 15:
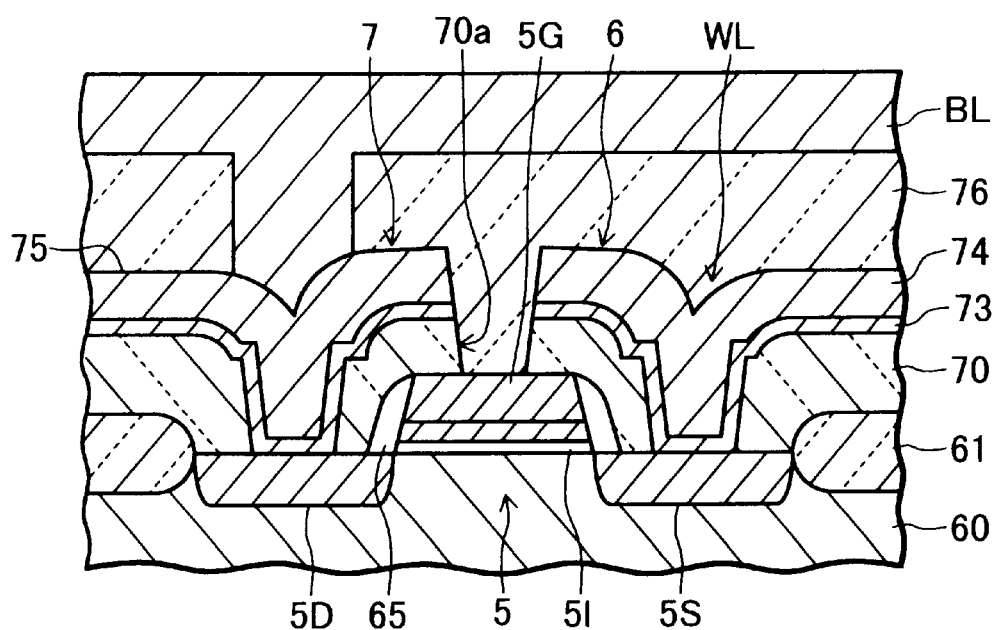
FIG. 15 is a cross sectional view of one memory cell of a ferroelectric memory device according to an eighth embodiment of the invention.

FIG. 15 is a cross sectional view of one memory cell of a ferroelectric memory device according to the eighth embodiment. In the sixth embodiment shown in FIG. 12D, the ferroelectric film 70 constituting the first capacitor 6 and the ferroelectric film 70 constituting the second capacitor 7 are formed by using a single continuous thin film. In the eighth embodiment, separate ferroelectric films 70 are used for the first and second capacitors 6 and 7. The other structures are similar to those of the sixth embodiment shown in FIG. 12D.

Separation of the ferroelectric films 70 can be realized by patterning the Pt film 74 and Ti film 73 of the sixth embodiment shown in FIG. 12D, and thereafter etching the ferroelectric film 70 using the same resist pattern. A groove 70a formed by the separation of the ferroelectric films 70 is buried with an interlayer insulating film 76.

A dielectric constant of the interlayer insulating film 76 is smaller than that of the ferroelectric film 70. Therefore, electric lines of force between the $IrO_2$ film 73 and gate electrode 5G can be generated preferentially along a depth direction of the ferroelectric film 70. The properties of the first and second capacitors 6 and 7 can therefore be improved.

FIGS. 16A to 16D are cross sectional views of one memory cell illustrating a method of manufacturing a ferroelectric memory device according to the ninth embodiment. The substrate shown in FIG. 16A can be formed by processes nearly similar to the processes of forming the substrate shown in FIG. 12B of the sixth embodiment. In the ninth embodiment, however, the side wall insulating films 65 shown in FIG. 12B are not formed.

Figure 16A:
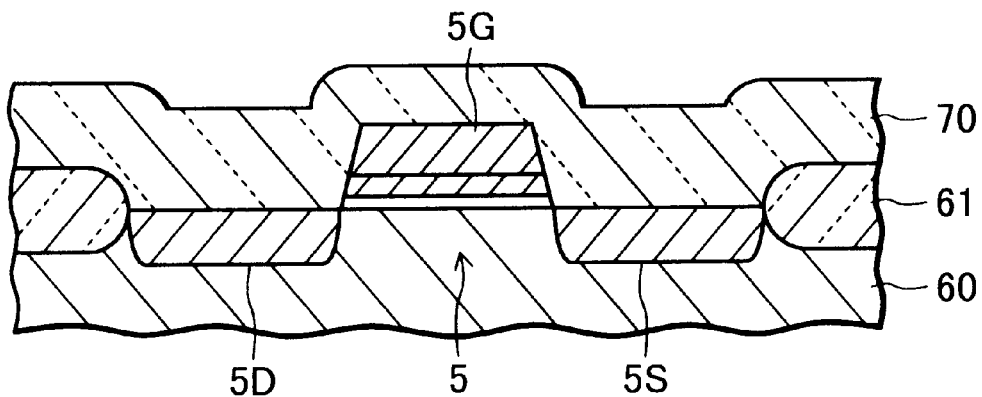
FIGS. 16A, 16B, 16C and 16D are cross sectional views of one memory cell illustrating a method of manufacturing a ferroelectric memory device according to a ninth embodiment of the invention.
Figure 16B:
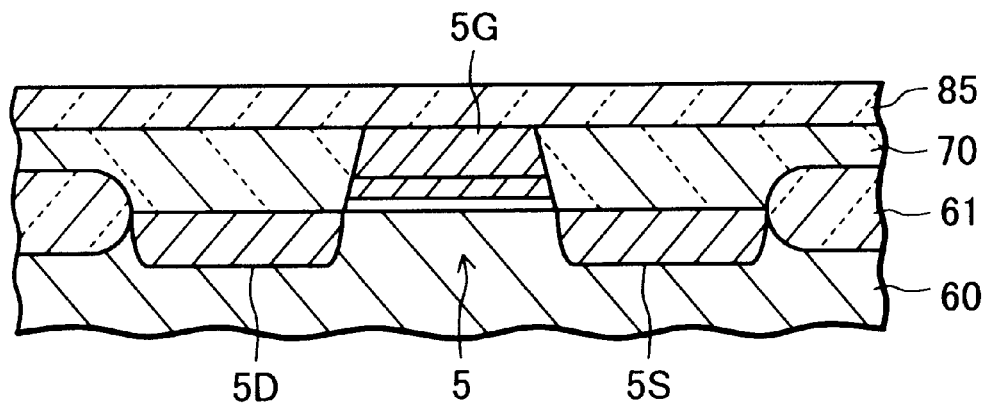

As shown in FIG. 16B, the surface of a ferroelectric film 70 is planarized through chemical mechanical polishing (CMP). When the upper surface of a Pt film 5G is exposed, CMP is stopped. An $SiO_2$ film 85 of 200 nm in thickness is deposited by CVD over the whole surface of the substrate.

Figure 16C:
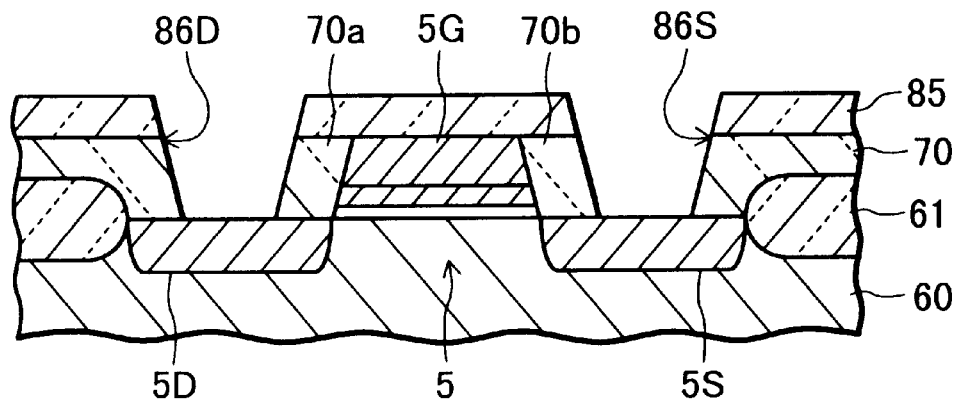

As shown in FIG. 16C, contact holes 86S and 86D are formed to expose partial surface areas of the source/drain regions 5S and 5D. Etching the $SiO_2$ film 85 and ferroelectric film 70 is performed by RIE using a mixed gas of $CF_4$ and Ar. A ferroelectric film 70b is left between one side wall of the gate electrode 5G and the contact hole 86S, and a ferroelectric film 70a is left between the other side wall of the gate electrode 5G and the contact hole 86D.

Figure 16D:
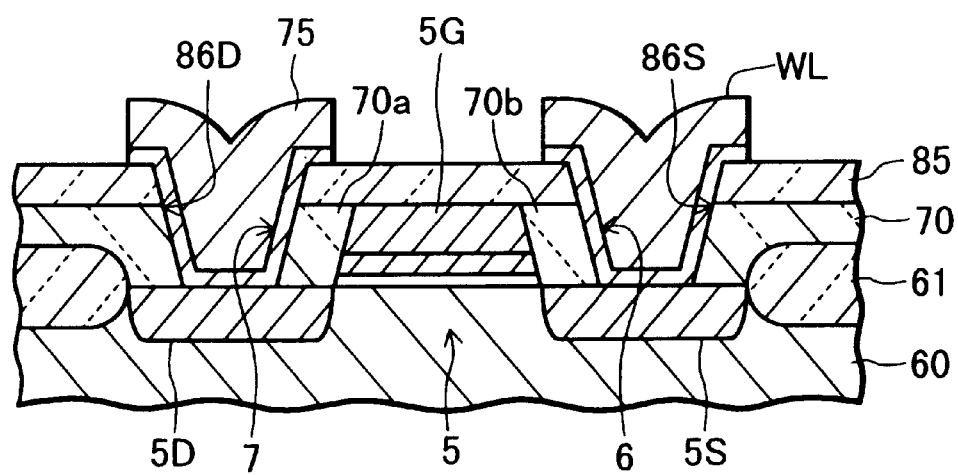

As shown in FIG. 16D, a drain electrode 75 is formed which is filled in the contact hole 86D and connected to the drain region 5D. A word line WL is formed which is filled in the contact hole 86S and connected to the source region 5S. The drain electrode 75 and word line WL are formed by a method similar to the method of forming the drain electrode 75 and word line WL shown in FIG. 12D.

In the ninth embodiment shown in FIG. 16D, a ferroelectric film is not formed on the upper surface of the gate electrode 5G, but the ferroelectric films 70a and 70b are formed only on the side walls of the gate electrode 5G. The first capacitor 6 is formed including the ferroelectric film 70b on the side wall, and the second capacitor 7 is formed including the ferroelectric film 70a on the side wall. Since the upper surface of the gate electrode 5G is not used as the capacitor, the gate length can be made short and high integration is possible.

Figure 17A:
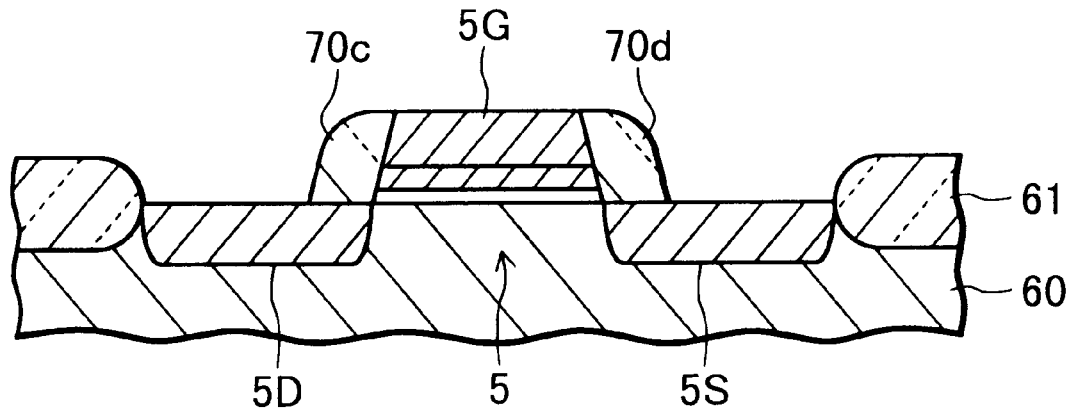
FIGS. 17A and 17B are cross sectional views of one memory cell illustrating a method of manufacturing a ferroelectric memory device according to a modification of the ninth embodiment.
Figure 17B:
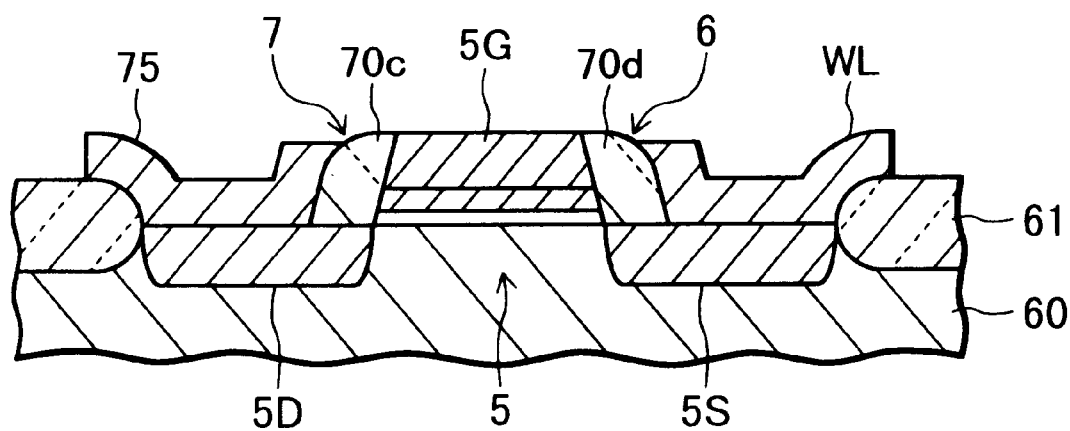

FIGS. 17A and 17B are cross sectional views of one memory cell illustrating a method of manufacturing a ferroelectric memory device according to a modification of the ninth embodiment. The substrate shown in FIG. 16A is obtained by the processes similar to those used by the ninth embodiment. The ferroelectric film 70 is anisotropically etched to leave it only on the side walls of the gate electrode 5G. This anisotropic etching is performed, for example, by RIE using a mixed gas of $CF_4$ and Ar.

FIG. 17A shows the substrate after the anisotropic etching. Ferroelectric films 70c and 70d are left on the side walls of the gate electrode 5G, and the surfaces of the source region 5S and drain region 5D are exposed.

As shown in FIG. 17B, a drain electrode connected to the drain region 5D and a word line WL connected to the source region 5S are formed. The drain electrode 75 and word line WL are formed by a method similar to the method of forming the drain electrode 75 and word line WL shown in FIG. 12D.

Similar to the ninth embodiment, also in the modification of the ninth embodiment, the first capacitor 6 is formed including the ferroelectric film 70d on the side wall of the gate electrode 5G, and the second capacitor 7 is formed including the ferroelectric film 70d. Since the upper surface of the gate electrode 5G is not used as the capacitor, the gate length can be made short and high integration is possible.

In each drawing used for describing the seventh to ninth embodiments, one memory cell is disposed in one active region. Two memory cells may be disposed in one active region as in the first embodiment shown in FIGS. 4A to 4D.

Figure 18:
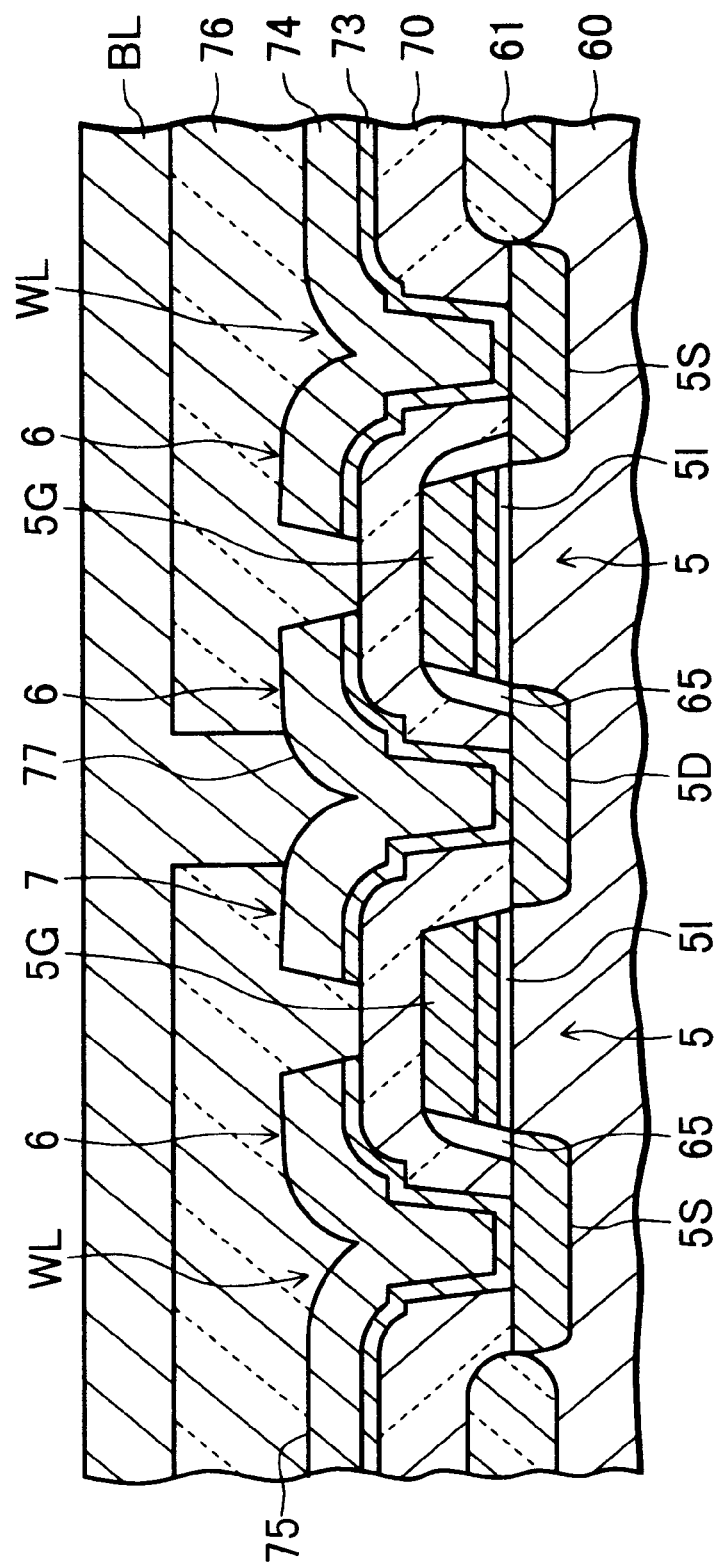
FIG. 18 is a cross sectional view of a ferroelectric memory device according to a modification of the sixth embodiment.

FIG. 18 is a cross sectional view of a ferroelectric memory device in which two memory cells of the sixth embodiment are disposed in one active region. The structure of one memory cell is the same as that shown in FIG. 12D. A drain region 5D disposed in a central area in FIG. 18 is shared by two memory cells.

The drain region 5D is connected to a bit interconnect electrode 77 which is a lamination of an $IrO_2$ film 73 and a Pt film 74. This bit interconnect electrode 77 forms the second capacitor 7 together with the gate electrodes 5G of MISFET's on both sides thereof. A bit line BL is formed on an interlayer insulating film 76. The bit line BL is electrically connected to the bit line interconnect electrode 77 via a contact hole formed through the interlayer insulating film 76.

Next, with reference to FIGS. 19A to 19E and FIG. 20, the tenth embodiment will be described.

Processes of forming the substrate shown in FIG. 19A are the same as general processes of forming a MISFET. On the surface of a p-type silicon substrate 90, a memory cell area and a peripheral circuit area are defined. In a surface layer of the memory cell area, a p-type well 91 is formed, and in a surface layer of the peripheral circuit area, an n-type well 92 and a p-type well 93 are formed. A field oxide film 94 formed on the surface of the silicon substrate 90 defines active regions of the wells.

In the p-type well 91, an n-channel MISFET 96 is formed, in the n-type well 92, a p-channel MISFET 97 is formed, and in the p-type well 93, an n-channel MISFET 98 is formed. Each of gate insulating films 96I, 97I, and 98I of MISFET's is an $SiO_2$ film having a thickness of 7 nm. Each of gate electrodes 96G, 97G, and 98G is an $n^+$-type polysilicon film having a thickness of 180 nm. On the side walls of each gate electrode, 96G, 97G, 98G, side wall insulating films are formed.

As shown in FIG. 19B, an SiO₂ film 100 is formed over the whole surface of the silicon substrate 90 to a thickness of 200 nm. For example, the SiO₂ film 100 is formed by CVD using SiH₄ and O₂.

As shown in FIG. 19C, the surface of the SiO₂ film 100 is planarized through chemical mechanical polishing (CMP). CMP is stopped when the surfaces of the gate electrodes 96G, 97G, and 98G made of polysilicon are exposed. On the planarized surface of the SiO₂ film 100, an IrO₂ film of 50 nm in thickness and a Pt film of 175 nm in thickness are laminated. This two layers are patterned to leave a lower capacitor electrode 102 which covers the upper surface of the gate electrode 96G.

The shape of the lower capacitor electrode 102 as viewed along a direction normal to the substrate surface may be identical to that of the gate electrode, or may be larger than the shape of the gate electrode 96G as will be later described with reference to FIG. 20.

As shown in FIG. 19D, an SBT film is formed on the SiO₂ film to a thickness of 200 nm. The SBT film is formed by a method similar to the method of forming the ferroelectric film 70 of the sixth embodiment described with FIG. 12B. The SBT film in the peripheral circuit area is removed to leave a ferroelectric film 103 made of SBT in the memory cell area. The ferroelectric film 103 covers the lower capacitor electrode 102. If the SBT film is formed by a sol-gel method, the surface thereof is likely to become even. Therefore, the thickness of the ferroelectric film 103 on the lower capacitor electrode 102 becomes thinner than that in the other area.

As shown in FIG. 19E, contact holes are formed through the ferroelectric film 103 and SiO₂ film 100 to expose the surfaces of the source and drain regions of MISFET 96. For example, etching the ferroelectric film 103 is performed by RIE using a mixed gas of CF₄ and Ar, and etching the SiO₂ film 100 is performed by RIE using a mixed gas of CF₄ and H₂.

An IrO₂ film of 50 nm in thickness and a Pt film of 100 nm in thickness are laminated on the top surface of the substrate. These two layers are patterned to leave a word line WL and a bit interconnect electrode 107. The word line WL is connected to the source region 96S of MISFET 96 via a contact hole 105, and the bit line interconnect electrode 107 is connected to the drain region 96D of MISFET 96 via a contact hole 105.

The word line WL and lower capacitor electrode 102 form the first ferroelectric capacitor, and the bit line interconnect electrode 107 and the lower capacitor electrode 102 form the second ferroelectric capacitor.

In the tenth embodiment, the gate electrode of MISFET 96 in the memory cell area is made of polysilicon, similar to the gate electrodes of MISFET's 97 and 98 in the peripheral circuit area. Therefore, MISFET in the memory cell area can be formed at the same time when MISFET in the peripheral circuit area is formed.

Figure 20:
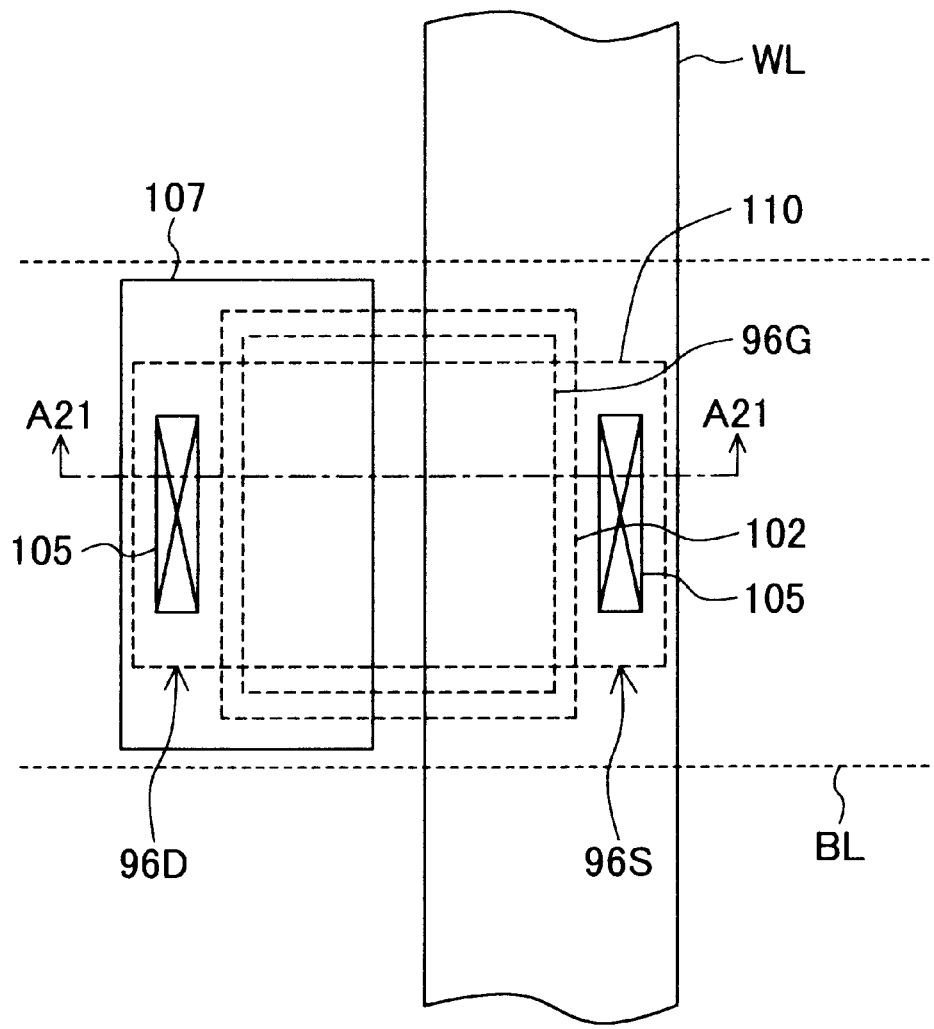
FIG. 20 is a plan view of one memory cell of the ferroelectric memory device of the tenth embodiment.

FIG. 20 is a plan view of a memory cell of the ferroelectric memory device according to the tenth embodiment. The cross sectional view taken along one-dot chain line A21—A21 of FIG. 20 corresponds to the cross sectional view of MISFET 96 shown in FIG. 19E.

The gate electrode 96G covers the active area 110 excepting right and left end areas thereof as viewed in FIG. 20. Roughly a left half area of the lower capacitor electrode 102 as viewed in FIG. 20 is covered with the bit line interconnect electrode 107, and the right half area is covered with the word line WL. The bit interconnect electrode 107 is connected to the drain region 96D via a contact hole 105, and the word line WL is connected to the source region 96S via the other contact hole 105.

In the tenth embodiment, the gate electrode 96G and lower capacitor electrode 102 are patterned by different patterning processes. Therefore, the shapes thereof can be determined independently from each other. As shown in FIG. 20, since the lower capacitor electrode 102 is made larger than the gate electrode 96G, the electrostatic capacitance of the ferroelectric capacitor can be made large.

In the tenth embodiment, although the lower capacitor electrode 102 is made of two layers of the IrO₂ film and Pt film, other structures may also be used. For example, the IrO₂ layer may be replaced by a TiN layer, or a lamination structure of a Ti layer and a TiN layer stacked in this order may be used. The Ti layer functions as an adhesion layer, and the TiN layer functions as a diffusion preventing layer. The Pt layer may be replaced by an Ir layer.

In the tenth embodiment, two adjacent memory cells may be formed in one active region and the drain region may be shared by two MISFET's, similar to the modification of the sixth embodiment shown in FIG. 18. The bit line may be directly connected to the drain region, as shown in FIG. 4D.

The present invention has been described in connection with the preferred embodiments. The invention is not limited only to the above embodiments. It is apparent that various modifications, improvements, combinations, and the like can be made by those skilled in the art.

What is claimed is:

1. A ferroelectric memory device comprising:
   a field effect transistor including a source region, a drain region, and a gate electrode;
   a first ferroelectric capacitor connected between the source region and the gate electrode; and
   a second ferroelectric capacitor connected between the drain region and the gate electrode.

2. A ferroelectric memory device according to claim 1, wherein the gate electrode essentially consists of polysilicon, and the ferroelectric memory device further comprises a lower capacitor electrode made of Pt or Ir and disposed on the gate electrode, said lower capacitor electrode being one of two electrodes of each of said first and second ferroelectric capacitors.

3. A ferroelectric memory device according to claim 1, wherein:
   ferroelectric films of said first and second ferroelectric capacitors cover the gate electrode; and
   an electrode of said first ferroelectric capacitor connected to the source region and an electrode of said second ferroelectric capacitor connected to the drain region are disposed overlapping the gate electrode as viewed along a direction normal to a substrate surface.

4. A ferroelectric memory device according to claim 3, wherein the ferroelectric films of said first and second ferroelectric capacitors consist of one continuous thin film.

5. A ferroelectric memory device according to claim 3, wherein:
   the ferroelectric films of said first and second ferroelectric capacitors are formed on a surface of the gate electrode and spaced by a distance in an in-plane direction of the ferroelectric films; and
   the ferroelectric memory device further comprises an embedding member made of insulating material having a dielectric constant smaller than a dielectric constant of the ferroelectric films of said first and second ferroelectric capacitors, said embedding member being formed on the gate electrode and embedding a space between the ferroelectric films of said first and second ferroelectric capacitors.

6. A ferroelectric memory device according to claim 1, wherein an electrostatic capacitance of said first ferroelectric capacitor is generally equal to an electrostatic capacitance of said second ferroelectric capacitor.

7. A ferroelectric memory device according to claim 1, wherein an electrode of said first ferroelectric capacitor connected to the source region extends along a first direction in a substrate surface and constitutes a first wiring.

8. A ferroelectric memory device according to claim 7, wherein an electrode of said second ferroelectric capacitor connected to the drain region extends along a second direction in a substrate surface and constitutes a second wiring, the second direction intersecting the first direction, and said ferroelectric memory device further comprising an interlayer insulating film insulating the first wiring from the second wiring at an intersecting point of the first and second wirings.

9. A ferroelectric memory device according to claim 1, further comprising:
 a first protective insulating film covering a surface of the source region excepting a surface area in contact with said first ferroelectric capacitor; and
 a second protective insulating film covering a surface of the drain region excepting a surface area in contact with said second ferroelectric capacitor.

10. A ferroelectric memory device according to claim 1, further comprising side wall insulating films consisting of insulating material and covering side walls of the gate electrode.

11. A ferroelectric memory device according to claim 1, wherein an electrode of said first ferroelectric capacitor connected to the source region and an electrode of said second ferroelectric capacitor connected to the drain region oppose side walls of the gate electrode via ferroelectric films of said first and second ferroelectric capacitors and are not disposed on an upper surface of the gate electrode.

12. A ferroelectric memory device comprising:
 a plurality of first wirings extending along a first direction on a surface of a substrate;
 a plurality of second wirings extending along a second direction on the surface of the substrate, the second direction intersecting the first direction;
 an interlayer insulating film for electrically insulating said first and second wirings at each cross point between said first and second wirings; and
 a plurality of memory cells each disposed at each cross point between said first and second wirings, each of said memory cells comprising a field effect transistor, a first ferroelectric capacitor, and a second ferroelectric capacitor, each field effect transistor including a source region, a drain region, and a gate electrode, the first ferroelectric capacitor being connected between the source region and the gate electrode of the field effect transistor of a corresponding memory cell, the second ferroelectric capacitor being connected between the drain region and the gate electrode of the field effect transistor of the corresponding memory cell, the source region being connected to a corresponding first wiring, and the drain region being connected to a corresponding second wiring.

13. A ferroelectric memory device according to claim 12, further comprising:
 a first control circuit connected to said first wirings for selectively applying a first write signal to one of said plurality of first wirings;
 a second control circuit connected to said second wirings for selectively applying a second write signal to one of said plurality of second wirings, said second control signal applying the second write signal so that residual polarization in a specific direction occurs in ferroelectric films of the first and second ferroelectric capacitors of a memory cell at a cross point between the first wiring applied with the first write signal and the second wiring applied with the second write signal and that a polarization direction of ferroelectric films of first and second ferroelectric capacitors of the other memory cells is not changed.

14. A ferroelectric memory device according to claim 12, further comprising a switching element for selecting either a conductive state or a non-conductive state in response to an externally applied signal, said switching element connecting the source region of each memory cell and a corresponding first wiring or the drain region of the memory cell and a corresponding second wiring.

15. A ferroelectric memory device according to claim 12, wherein the drain regions of adjacent memory cells in the second direction are used in common.

16. A ferroelectric memory device according to claim 12, wherein an electrode of the first ferroelectric capacitor connected to the source region and said first wiring are formed by a same wiring layer.

17. A ferroelectric memory device according to claim 16, wherein an electrode of the second ferroelectric capacitor connected to the drain region and said second wiring are formed by a same wiring layer.

18. A ferroelectric memory device according to claim 16, wherein:
 the electrode of the second ferroelectric capacitor connected to the drain region and said first wiring are formed by a same wiring layer; and
 said second wiring is connected to an electrode of the second ferroelectric capacitor of a corresponding memory cell connected to the drain region, via a contact hole formed in said interlayer insulating film.

19. A ferroelectric memory device according to claim 12, further comprising:
 third and fourth wirings formed over the substrate;
 a dummy cell whose one terminal is connected to said third wiring and whose other terminal is connected to said fourth wiring; and
 a comparator circuit for comparing a current flowing through said second wiring with a current flowing through said fourth wiring.

20. A ferroelectric memory device according to claim 19, wherein said dummy cell comprises:
 a dummy field effect transistor whose source region is connected to said third wiring and whose drain region is connected to said fourth wiring;
 a third ferroelectric capacitor connected between a gate electrode and the source region of the dummy field effect transistor; and
 a fourth ferroelectric capacitor connected between the gate electrode and the drain region of the dummy field effect transistor.

21. A ferroelectric memory device according to claim 20, wherein a resistance value of the dummy field effect transistor in a conductive state is larger than a resistance value of the field effect transistor of said memory cell in the conductive state.

* * * * *